United States Patent
Lansalot-Matras et al.

(10) Patent No.: US 10,648,087 B2
(45) Date of Patent: May 12, 2020

(54) ETCHING REACTANTS AND PLASMA-FREE ETCHING PROCESSES USING THE SAME

(71) Applicants: L'Air Liquide, Société Anonyme pour l'Etude et l'Exploitation des Procédés Georges Claude, Paris (FR); Clément Lansalot-Matras, Princeton, NJ (US); Jooho Lee, Seoul (KR); Jean-Marc Girard, Versailles (FR); Nicolas Blasco, Grenoble (FR); Satoko Gatineau, Seoul (KR)

(72) Inventors: Clément Lansalot-Matras, Princeton, NJ (US); Jooho Lee, Seoul (KR); Jean-Marc Girard, Versailles (FR); Nicolas Blasco, Grenoble (FR); Satoko Gatineau, Seoul (KR)

(73) Assignee: L'Air Liquide, SociétéAnonyme pour l'Exploitation et l'Etude des Procédés Georges Claude, Paris (FR)

( * ) Notice: Subject to any disclaimer, the term of this patent is extended or adjusted under 35 U.S.C. 154(b) by 0 days.

(21) Appl. No.: 15/774,892

(22) PCT Filed: Sep. 1, 2016

(86) PCT No.: PCT/US2016/049857
§ 371 (c)(1),
(2) Date: May 9, 2018

(87) PCT Pub. No.: WO2016/172740
PCT Pub. Date: Oct. 27, 2016

(65) Prior Publication Data
US 2018/0327913 A1   Nov. 15, 2018

Related U.S. Application Data

(60) Provisional application No. 62/253,507, filed on Nov. 10, 2015.

(51) Int. Cl.
*C23F 1/12* (2006.01)
*H01L 21/311* (2006.01)
(Continued)

(52) U.S. Cl.
CPC .............. *C23F 1/12* (2013.01); *C23C 8/80* (2013.01); *H01L 21/31116* (2013.01);
(Continued)

(58) Field of Classification Search
CPC ...................................................... C23F 1/12
See application file for complete search history.

(56) References Cited

U.S. PATENT DOCUMENTS

| | | |
|---|---|---|
| 4,343,676 A | 8/1982 | Tarng |
| 4,793,897 A | 12/1988 | Dunfield et al. |

(Continued)

FOREIGN PATENT DOCUMENTS

| | | |
|---|---|---|
| JP | H09 228053 | 9/1997 |
| JP | H10 113536 | 5/1998 |

(Continued)

OTHER PUBLICATIONS

Aarik, J. et al., "Mechanisms of suboxide growth and etching in atomic layer deposition of tantalum oxide from $TaCl_5$ and $H_2O$," Applied Surface Science 103 (1996), 331-341.
(Continued)

*Primary Examiner* — Roberts P Culbert
(74) *Attorney, Agent, or Firm* — Yan Jiang; Patricia E. McQueeney

(57) ABSTRACT

Disclosed are processes of removing layers from substrates using fluorinated reactants having the formula $MF_x(adduct)_n$, wherein x ranges from 2 to 6 inclusive; n ranges from 0 to 5 inclusive; M is selected from the group consisting of P, Ti, Zr, Hf, V, Nb, Ta, Mo, and W; and the adduct is a neutral organic molecule selected from THF, dimethylether, diethy-
(Continued)

lether, glyme, diglyme, triglyme, polyglyme, dimethylsulphide, diethylsulphide, or methylcyanide. The fluorinated reactants dry etch the nitride layers without utilizing any plasma.

16 Claims, 12 Drawing Sheets

(51) Int. Cl.
*H01L 21/3213* (2006.01)
*H01L 21/67* (2006.01)
*C23C 8/80* (2006.01)
*H01L 21/02* (2006.01)
*B08B 9/08* (2006.01)

(52) U.S. Cl.
CPC .. *H01L 21/31122* (2013.01); *H01L 21/32135* (2013.01); *H01L 21/67069* (2013.01); *B08B 9/083* (2013.01); *H01L 21/02244* (2013.01); *H01L 21/02247* (2013.01)

(56) References Cited

U.S. PATENT DOCUMENTS

| | | | |
|---|---|---|---|
| 5,855,689 | A | 1/1999 | Akiyama |
| 5,879,646 | A | 3/1999 | Orihara et al. |
| 6,077,451 | A | 6/2000 | Takenaka et al. |
| 6,143,191 | A | 11/2000 | Baum et al. |
| 6,261,934 | B1 | 7/2001 | Kraft et al. |
| 6,284,052 | B2 | 9/2001 | Nguyen et al. |
| 9,130,158 | B1 | 9/2015 | Shen et al. |
| 9,391,267 | B2 | 7/2016 | Shen et al. |
| 2005/0019977 | A1 | 1/2005 | Shiva |
| 2005/0082002 | A1 | 4/2005 | Sato et al. |
| 2015/0050807 | A1* | 2/2015 | Wu .............. H01L 21/28556 438/669 |

FOREIGN PATENT DOCUMENTS

| | | |
|---|---|---|
| JP | 2007 141918 | 6/2007 |
| WO | WO 2015 194178 | 12/2015 |

OTHER PUBLICATIONS

Baroch, C.J. et al., "Preparation of zirconium from zirconium tetrafluoride," U.S. Atomic Energy Commission, Physical Sciences Reading Room, Unclassified ISC-720, Ames Laboratory, Iowa State College, May 31, 1956, 1-18.

Jenkins, W.A. et al., "Tantalum oxychloride," J. Inorg. Nucl. Chem. 1959, 11, 163-164.

Knapas, K. et al., "Etching of $Nb_2O_5$ thin films by $NbCl_5$," Chem. Vap. Deposition 2009, 15, 269-273.

Kukli, K. et al., "Atomic layer deposition of tantalum oxide thin films form iodide precursor," Chem. Mater. 2001, 13, 122-128.

Mercier, F. et al., "Niobium nitride thin films deposited by high temperature chemical vapor deposition," Surface & Coatings Technology 260 (2014) 126-132.

Sha, L. et al., "Ion-enhanced chemical etching of $ZrO_2$ in a chlorine discharge," J. Vac. Sci. Technol. A 20(5), Sep./Oct. 2002, 1525-1531.

Sha, L. et al., "Plasma etching selectivity of $ZrO_2$ to Si in $BCl_3/Cl_2$ plasmas," J. Vac. Sci. Technol. A 21(6), Nov./Dec. 2003, 1915-1922.

Sungauer, E. et al., "Etching mechanisms of $HfO_2$, $SiO_2$, and poly-Si substrates in $BCl_3$ plasmas," J. Vac. Sci. Technol. B 25(5), Sep./Oct. 2007, 1640-1646.

Woo, J.-C. et al., "A study on dry etching for profile and selectivity of $ZrO_2$ thin films over Si by using high density plasma," Thin Solid Films 517 (2009), 4246-4250.

International Search Report and Written Opinion for corresponding PCT//US2016/049857, dated Dec. 19, 2016.

* cited by examiner

US 10,648,087 B2

ETCHING REACTANTS AND PLASMA-FREE ETCHING PROCESSES USING THE SAME

CROSS REFERENCE TO RELATED APPLICATIONS

The present application is a 371 of International PCT Application PCT/US2016/049857, filed Sep. 1, 2016, which claims the benefit of U.S. Provisional Application Ser. No. 62/253,507 filed Nov. 10, 2015, herein incorporated by reference in its entirety for all purposes.

TECHNICAL FIELD

Disclosed are thermal processes of removing layers from substrates using fluorinated reactants having the formula $MF_x(adduct)_n$, wherein x ranges from 2 to 6 inclusive; n ranges from 0 to 5 inclusive; M is an element selected from the group consisting of P, Ti, Zr, Hf, V, Nb, Ta, Mo, and W; and the adduct is a neutral organic molecule selected from THF, dimethylether, diethylether, glyme, diglyme, triglyme, polyglyme, dimethylsulphide, diethylsulphide, or methylcyanide. The fluorinated reactants dry etch the layers without utilizing any plasma.

BACKGROUND

With the introduction of new materials in the CMOS gate stacks, such as metal and high-k materials, etching has to address new challenges. Some challenges include process selectivity to avoid formation of silicon recesses and to obtain a low surface roughness, gate-etch anisotropy, atomic or multi-atomic layer scale control of the etching rate, absence of residues, and cleaning of the reactor walls after the process.

The critical dimensions in advanced gate stacks have to be tightly controlled. This control requires a perfect wafer-to-wafer reproducibility. However, process drifts, which can generate changes in etch rates, etching profiles, etching selectivity, etching uniformity, and more generally of the process performance, are often observed in front-end etching processes. These process drifts can often be attributed to changes in the reactor wall conditions, e.g., the chemical composition of the reactor walls. For example, after depositing a metal gate stack ($Si/TiN/HfO_2$) on a substrate, hafnium oxide and titanium oxide residues may also coat the chamber walls. $F_2$, $NF_3$, and other halogens are typically used to remove any such coatings deposited on chamber walls. See, e.g., U.S. Pat. App. Pub. No. 2005/082002 to Kimura et al. which uses $F_2$ and NO to clean Si-containing films from a film-forming apparatus.

Plasma based processes are typically the method used to etch metal or metal oxide materials or remove un-wanted deposits thereof from a reactor. See, e.g., a cyclic plasma Bosch process using a fluorine-containing etching fluid, such as $PF_3$, and an unsaturated hydrogen-containing polymer deposition fluid (WO2015/194178 to L'Air Liquide, S.A.); plasma etching Si using $PF_5$ or $F_2$ (JP2007141918 to Matsushita Electric Ind. Co. Ltd.); $BCl_3$ based plasmas exhibit promising plasma chemistries to etch high-k materials and, in particular, $HfO_2$, with a high selectivity over $SiO_2$ and Si substrates (Sungauer et al., J. Vac. Sci. Technol. B 25 (2007) 1640-1646); chlorine plasma is found to chemically etch $ZrO_2$ thin films in an electron cyclotron resonance reactor (Sha et al., J. Vac. Sci. Technol., A 20 (2002) 1525); to improve the etching selectivity of $ZrO_2$, $BCl_3$ was added to a $Cl_2$ plasma to enhance the $ZrO_2$ etch rate while suppressing the silicon etch rate (Sha et al., J. Vac. Sci. Technol., A 21 (2003) 1915); and an investigation of the etching characteristics (etch rate, selectivity to Si) of $ZrO_2$ thin films in the $HBr/SF_6$ high density plasma system (Woo et al., Thin Solid Films 517 (2009) 4246-4250).

Dry plasma etching processes have some disadvantages such as the cost of the equipment, the use of toxic or corrosive gases, and potential damage to the underlying substrate.

H. Schafer (Z. Anorg. Allg. Chem. 1960, 305, 341) and W. A. Jenkins (J. Inorg. Nucl. Chem. 1959, 11, 163) described the thermal etching process of Tantalum oxide ($Ta_2O_5$) at temperatures between 200 and 350° C. according to the equation $Ta_2O_5(s)+3TaCl_5(g)\rightarrow 5\ TaOCl_3(g)$. The reaction is endothermic (~35 kcal/mol) and an increase of the etching rate with temperature was observed. Nonetheless, the etching rate was too slow (~$6\times10^{-2}$ A/Cy) to be suitable to replace existing plasma based processes. Knapas et al. (Chem. Vap. Deposition 2009, 15, pp. 269-273) found that $NbCl_5$ etches $Nb_2O_5$ film producing volatile $NbOCl_3$. Mercier et al. report that the $NbCl_5$ also reacts with the silica sidewalls of the reactor (Surface and Coatings Technology, 260, 2014, pp. 126-132).

U.S. Pat. No. 6,143,191 describes a method for thermally etching an Iridium containing material using $XeF_2$ as the etching co-reactant. U.S. Pat. No. 6,284,052 describes a method of cleaning metal deposition by-products from interior surfaces of a chemical vapor deposition (CVD) chamber by introducing hydrolysed hexafluoroacetylacetonate (Hhfac) vapor into the chamber to volatilize the oxidized metal deposition by-products.

U.S. Pat. No. 6,077,451 describes a method of etching of silicon oxide ($SiO_2$) by using Xenon fluoride like $XeF_4$, $XeF_6$, $OF_2$, $O_2F_2$, and $IF_6$.

U.S. Pat. Nos. 9,130,158 and 9,391,267 to Lam Research Corp. disclose a method for etching a stack with at least one metal layer in one or more cycles by transforming part of the metal layer into a metal oxide, metal halide, or lattice damaged metallic site and providing an organic solvent vapor and an organic ligand solvent to form a volatile organometallic compound.

A need remains for improved gaseous thermal etching and chamber cleaning processes.

Notation and Nomenclature Certain abbreviations, symbols, and terms are used throughout the following description and claims, and include:

As used herein, the term "remove," "removing," "cleaning," "etch," or "etching" refers to a process of forming a volatile reaction product by contacting a non plasma vapor with a layer that is to be removed from an underlying substrate (i.e., a dry non-plasma etch process).

The term "selectivity" means the ratio of the etch rate of one material to the etch rate of another material. The term "selective etch" or "selectively etch" means to etch one material more than another material, or in other words to have a greater or less than 1:1 etch selectivity between two materials.

As used herein, the indefinite article "a" or "an" means one or more.

As used herein, the terms "approximately" or "about" mean±10% of the value stated.

As used herein, the term "ranges from . . . inclusive" or "inclusively ranges from . . . " means that the range includes the endpoints. In other words, "x ranges from 2 to 6 inclusive" means that x may be 2 or 6, as well as all points in between.

As used herein, the abbreviation A refers to an Angstrom, which is a unit of length equivalent to 0.1 nm.

As used herein, 1 Torr is a unit of pressure equivalent to 133.3 Pa.

The standard abbreviations of the elements from the periodic table of elements are used herein. It should be understood that elements may be referred to by these abbreviations (e.g., S refers to sulfur, Si refers to silicon, H refers to hydrogen, etc.).

Please note that the films or layers deposited, such as Vanadium oxide, are listed throughout the specification and claims without reference to their proper stoichiometry (i.e., $VO_2$, $V_2O_3$, $V_2O_5$). The layers may include pure (M) layers, carbide ($M_oC_p$) layers, nitride ($M_kN_l$) layers, oxide ($M_nO_m$) layers, or mixtures thereof, wherein M is an element and k, l, m, n, o, and p inclusively range from 1 to 6 inclusive. For instance, Vanadium oxide is $V_kO_l$, where k and l each range from 0.5 to 5 inclusive. More preferably Vanadium oxide is $VO_2$, $V_2O_3$ or $V_2O_5$. The oxide layer may be a mixture of different binary or ternary oxides layers. For example, the oxide layer may be $SrTiO_x$, $BaTiO_x$, $HfZrO_x$, $HfTiO_x$, $HfYO_x$, $ZrYO_x$, $TiAlO_x$, $ZrErO_x$, $ZrLaO_x$, $ZrDyO_x$, $HfDyO_x$, $HfLaO_x$, $TiErO_x$, $TiYO_x$, wherein x ranges from 1 to 6 inclusive. The oxide layer may be a stack of different oxides layers, such as for example $HfO_2/Al_2O_3$ nanolaminates. Any referenced layers may also include a Silicon oxide layer, $Si_3O_m$, wherein n ranges from 0.5 to 1.5 inclusive and m ranges from 1.5 to 3.5 inclusive. More preferably, the silicon oxide layer is $SiO_2$ or $SiO_3$. The silicon oxide layer may be a silicon oxide based dielectric material, such as organic based or silicon oxide based low-k dielectric materials such as the Black Diamond II or III material by Applied Materials, Inc. Alternatively, any referenced silicon-containing layer may be pure silicon. Any silicon-containing layers may also include dopants, such as B, C, P, As and/or Ge.

SUMMARY

Disclosed are etching processes of removing layers from substrates using fluorinated reactants. Vapors of the fluorinated reactant are introduced into a reactor containing the layer on a substrate and reacted with at least part of the layer to form volatile fluorinated species. The volatile fluorinated species are removed from the reactor. The disclosed methods may include one or more of the following aspects:

the fluorinated reactant having the formula $MF_x(adduct)_n$, wherein M is an element from the Periodic Table; x ranges from 2 to 6 inclusive; n ranges from 0 to 5 inclusive; and the adduct is a neutral organic molecule selected from THF, dimethylether, diethylether, glyme, diglyme, triglyme, polyglyme, dimethylsulphide, diethylsulphide, or methylcyanide;

M being an element selected from the group consisting of Ti, Zr, Hf, V, Ta, Mo, and W;

M being an element selected from the group consisting of Ti, Zr, Hf, V, Mo, and W;

M being P;

the fluorinated reactant having the formula $MF_x$, wherein M is an element from Group IV of the Periodic Table (i.e., Ti, Zr, or Hf) and x ranges from 2 to 6 inclusive;

The fluorinated reactant having the formula $MF_x$, wherein M is an element from Group V of the Periodic Table (i.e., V, Nb, or Ta) and x ranges from 2 to 6 inclusive;

The fluorinated reactant having the formula $MF_x$, wherein M is Mo or W and x ranges from 2 to 6 inclusive;

the fluorinated reactant being $TiF_4$;

the fluorinated reactant being $ZrF_4$;

the fluorinated reactant being $HfF_4$;

the fluorinated reactant being $VF_5$;

the fluorinated reactant being $NbF_5$;

the fluorinated reactant being $TaF_5$;

the fluorinated reactant being $MoF_6$;

the fluorinated reactant being $WF_6$;

the fluorinated reactant being $PF_3$;

the fluorinated reactant being $PF_5$;

the fluorinated reactant further comprising a solvent selected from the group consisting of THF, dimethylether, diethylether, glyme, diglyme, triglyme, polyglyme, dimethylsulphide, diethylsulphide, and methylcyanide;

the fluorinated reactant having the formula $MF_x(adduct)_n$, wherein M is an element from the Periodic Table, x ranges from 2 to 6 inclusive, n ranges from 1 to 5 inclusive, and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant having the formula $MF_x(adduct)_n$, wherein M is an element from Group IV of the Periodic Table (i.e., Ti, Zr, or Hf), x ranges from 2 to 6 inclusive, n ranges from 1 to 5 inclusive, and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant having the formula $MF_x(adduct)_n$, wherein M is an element from Group V of the Periodic Table (i.e., V, Nb, or Ta), x ranges from 2 to 6 inclusive, n ranges from 1 to 5 inclusive, and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant having the formula $MF_x(adduct)_n$, wherein M is Mo or W, x ranges from 2 to 6 inclusive, n ranges from 1 to 5 inclusive, and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant being a $TiF_4(adduct)_n$, wherein n ranges from 1 to 5 inclusive and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant being a $ZrF_4(adduct)_n$, wherein n ranges from 1 to 5 inclusive and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant being a $NbF_5(adduct)_n$, wherein n ranges from 1 to 5 inclusive and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant being a $TaF_5(adduct)_n$, n ranges from 1 to 5 inclusive and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant being $NbF_5(SEt_2)$;
the fluorinated reactant being $NbF_4(SEt_2)$;
the fluorinated reactant being $TaF_5(SEt_2)$;
the fluorinated reactant being $TaF_4(SEt_2)_2$;
the substrate being silicon oxide;
the substrate being a silicon wafer;
the substrate being stainless steel;
the substrate being aluminum oxide;
the substrate being aluminum nitride;
the layer being a nitride layer;
the nitride layer being selected from the group consisting of Titanium nitride, Vanadium nitride, Chromium nitride, Manganese nitride, Iron nitride, Cobalt nitride, Nickel nitride, Copper nitride, Zinc nitride, Gallium nitride, Germanium nitride, Strontium nitride, Yttrium nitride, Zirconium nitride, Niobium nitride, Molybdenum nitride, Ruthenium nitride, Rhodium nitride, Palladium nitride, Silver nitride, Cadmium nitride, Indium nitride, Tin nitride, Antimony nitride, Tellurium nitride, Cesium nitride, Hafnium nitride, Tantalum nitride, Tungsten nitride, Rhenium nitride, Osmium nitride, Lanthanum nitride, Cerium nitride, Praseodymium nitride, Neodymium nitride, Gadolimium nitride, Dysprosium nitride, Erbium nitride, Ytterbium nitride, Strontium Titanate, Barium Titanate, Hafnium Zirconium Nitride, Hafnium Titanate, Hafnium Yttrium nitride, Zirconium Yttrium nitride, Titanium aluminate, Zirconium Erbium nitride, Zirconium Lanthanum nitride, Zirconium Dysprosium nitride, Hafnium Dysprosium nitride, Hafnium Lanthanum nitride, Titanium Erbium nitride, and Titanium Yttrium nitride;
the nitride layer being titanium nitride, zirconium nitride, hafnium nitride, vanadium nitride, niobium nitride, tantalum nitride, molybdenum nitride, tungsten nitride, or combinations thereof;
the layer being a metal layer;
the metal layer being tungsten;
the metal layer being molybdenum;
the metal layer being a Group 4 metal (Ti, Hf, Zr);
the metal layer being a Group 5 metal (V, Nb, Ta);
the layer being an oxide layer;
the oxide layer being Scandium oxide ($Sc_2O_3$), Titanium oxide ($TiO_2$), Vanadium oxide ($VO_2$, $V_2O_3$, $V_2O_5$), Chromium oxide (CrO, $CrO_2$, $CrO_3$, $CrO_5$, $Cr_8O_{21}$), Manganese oxide (MnO, $Mn_3O_4$, $Mn_2O_3$, $MnO_2$, $Mn_2O_7$), Iron oxide ($FeO_2$, $Fe_2O_3$, $Fe_3O_4$, $Fe_4O_5$), Cobalt oxide (CoO, $Co_2O_3$, $Co_3O_4$), Nickel oxide (NiO, $Ni_2O_3$), Copper oxide (CuO, $Cu_2O$), Zinc oxide (ZnO), Gallium oxide ($Ga_2O_3$, GeO, $GeO_2$), Germanium oxide ($GeO_2$), Strontium oxide (SrO), Yttrium oxide ($Y_2O_3$), Zirconium oxide ($ZrO_2$), Niobium oxide ($Nb_2O_5$), Molybdenum oxide ($MoO_2$, $MoO_3$), Ruthenium oxide ($RuO_2$), Rhodium oxide ($Rh_2O_3$), Indium oxide ($In_2O_3$), Tin oxide (SnO, $SnO_2$), Antimony oxide ($SbsO_3$), Tellurium oxide ($TeO_2$), Cesium oxide ($Cs_{11}O_3$, $Cs_4O$, $Cs_7O$, $Cs_2O$), Barium oxide (BaO), Lutetium oxide ($Lu_2O_3$), Hafnium oxide ($HfO_2$), Tantalum oxide ($Ta_2O_5$), Tungsten oxide ($W_2O_3$, $WO_2$, $WO_3$, $W_2O_5$), Rhenium oxide ($Rh_2O_7$, $RhO_2$, $RhO_3$), Osmium oxide ($OsO_2$, $OsO_4$), Iridium oxide ($IrO_2$), Platinum oxide ($PtO_2$), Gold oxide ($Au_2O_3$), Bismuth oxide ($Bi_2O_3$), Lanthanum oxide ($La_2O_3$), Cerium oxide ($Ce_2O_3$), Praseodymium oxide ($Pr_2O_3$), Neodymium oxide ($Nd_2O_3$), Gadolimium oxide ($Gd_2O_3$), Dysprosium oxide ($Dy_2O_3$), Erbium oxide ($Er_2O_3$), Ytterbium oxide ($Yb_2O_3$), or any mixture of thereof;
the oxide layer being Titanium oxide ($TiO_2$);
the oxide layer being Zirconium oxide ($ZrO_2$);
the oxide layer being Hafnium oxide ($HfO_2$);
the oxide layer being Niobium oxide ($Nb_2O_5$);
the oxide layer being Molybdenum oxide ($MoO_2$, $MoO_3$);
the oxide layer being Tantalum oxide ($Ta_2O_5$);
the oxide layer being Tungsten oxide ($W_2O_3$, $WO_2$, $WO_3$, $W_2O_5$);
depositing the oxide layer by CVD, ALD or PVD;
oxidizing a metal layer to form the oxide layer;
completely oxidizing a metal layer in one step;
the metal layer having a thickness ranging from approximately 0.5 nm to approximately 200 nm inclusive;
oxidizing a top portion of a metal layer so that only the surface of the metal layer is oxidized;
the oxidized portion of the metal layer having a thickness ranging from approximately 0.2 nm to approximately 200 nm inclusive;
oxidizing a metal layer using an oxidizing agent selected from $O_2$, $H_2O$, $O_3$, $H_2O_2$, $N_2O$, disiloxane, alcohols, carboxylic acids, O plasma and radicals thereof, or combination thereof;
oxidizing a metal layer to form a metal oxide layer and sequentially removing the metal oxide layer in the same processing equipment;
oxidizing a metal layer to form a metal oxide layer in one processing chamber and sequentially removing the metal oxide layer in a different processing chamber;
repeating the step of oxidizing a metal layer to form a metal oxide layer and the step of removing the metal oxide layer more than one time to achieve the target metal layer removal thickness;
oxidizing a metal nitride layer to form a metal oxynitride layer and sequentially removing the metal oxynitride layer in the same processing equipment;
oxidizing a metal nitride layer to form a metal oxynitride layer in one processing chamber and sequentially removing the metal oxynitride layer in a different processing equipment;
repeating the step of oxidizing a metal nitride layer to form a metal oxynitride layer and the step of removing the metal oxynitride layer more than one time to achieve the target metal layer removal thickness;
selectively etching an oxide layer from a metal substrate;
selectively etching a $Nb_2O_5$ layer from an $Al_2O_3$ substrate;
selectively etching a $Ta_2O_5$ layer from an $Al_2O_3$ substrate;
selectively etching a $TiO_2$ layer from an $Al_2O_3$ substrate;
selectively etching a $ZrO_2$ layer from an $Al_2O_3$ substrate;
selectively etching a $HfO_2$ layer from an $Al_2O_3$ substrate;
selectively etching a $Nb_2O_5$ layer from a $SiO_2$ substrate;
selectively etching a $Ta_2O_5$ layer from a $SiO_2$ substrate;
selectively etching a $TiO_2$ layer from a $SiO_2$ substrate;
selectively etching a $ZrO_2$ layer from a $SiO_2$ substrate;
selectively etching a $ZrO_2$ layer from a $SiO_2$ substrate;
selectively etching a tungsten oxide layer from a tungsten substrate;
selectively etching a molybdenum oxide layer from a molybdenum substrate;
selectively etching a tantalum oxide layer from a tantalum substrate;
selectively etching a niobium oxide layer from a niobium substrate;
selectively etching a vanadium oxide layer from a vanadium substrate;

selectively etching a hafnium oxide layer from a hafnium substrate;
selectively etching a zirconium oxide layer from a zirconium substrate;
selectively etching a titanium oxide layer from a titanium substrate;
selectively etching an oxide or oxynitride layer from a nitride substrate;
selectively etching a tungsten oxide or oxynitride layer from a tungsten nitride substrate;
selectively etching a molybdenum oxide or oxynitride layer from a molybdenum nitride substrate;
selectively etching a tantalum oxide or oxynitride layer from a tantalum nitride substrate;
selectively etching a niobium oxide or oxynitride layer from a niobium nitride substrate;
selectively etching a vanadium oxide or oxynitride layer from a vanadium nitride substrate;
selectively etching a hafnium oxide or oxynitride layer from a hafnium nitride substrate;
selectively etching a zirconium oxide or oxynitride layer from a zirconium nitride substrate;
selectively etching a titanium oxide layer from a titanium substrate;
thermally etching at least part of the layer from the substrate;
not utilizing any plasma during the process;
introducing an inert gas into the reactor;
the inert gas being selected from the group consisting of $N_2$, He, Ar, Xe, Kr, and Ne;
the inert gas being Ar;
mixing the fluorinated reactant and the inert gas to produce a mixture prior to introduction into the reactor;
introducing the fluorinated reactant into the reactor separately from the inert gas;
introducing the inert gas being continuously into the reactor and introducing the fluorinated reactant into the reactor in pulses;
the inert gas comprising approximately 25% v/v to approximately 95% v/v of a total volume of fluorinated reactant and inert gas introduced into the reactor;
continuously introducing the vapor of the fluorinated reactant into the reactor for the entire process;
pulsing the vapor of the fluorinated reactant into the reactor during the process;
analyzing the volatile fluorinated species removed from the reactor;
measuring the exhaust for volatile fluorinated species by Quadropole mass spectrometer;
the chamber having a pressure ranging from approximately 0 Torr to approximately 500 Torr inclusive;
the chamber having a pressure ranging from approximately 50 mtorr to approximately 20 torr inclusive;
introducing the etch gas to the chamber at a flow rate ranging from approximately 0.1 sccm to approximately 1 slm inclusive;
maintaining the substrate at a temperature ranging from approximately 50° C. to approximately 500° C. inclusive; and
maintaining the substrate at a temperature ranging from approximately 100° C. to approximately 400° C. inclusive.

Also disclosed are etching compositions comprising a fluorinated reactant having the formula $MF_x(adduct)_n$, wherein M is an element from the periodic table; x ranges from 2 to 6 inclusive; n ranges from 0 to 5 inclusive; and the adduct is a neutral organic molecule selected from THF, dimethylether, diethylether, glyme, diglyme, triglyme, polyglyme, dimethylsulphide, diethylsulphide, or methylcyanide. The disclosed oxide layer etching compositions may include one or more of the following aspects:
n being 0;
M being an element selected from the group consisting of Ti, Zr, Hf, V, Nb, Ta, Mo, and W;
M being an element selected from the group consisting of Ti, Zr, Hf, V, Ta, Mo, and W;
M being an element selected from the group consisting of Ti, Zr, Hf, V, Mo, and W;
the fluorinated reactant having the formula $MF_x$, wherein M is an element from Group IV of the Periodic Table (i.e., Ti, Zr, or Hf) and x is 4;
the fluorinated reactant having the formula $MF_x$, wherein M is an element from Group V of the Periodic Table (i.e., V, Nb, or Ta) and x is 5;
the fluorinated reactant having the formula $MF_x$, wherein M is Mo or W and x is 6;
the fluorinated reactant being $TiF_4$;
the fluorinated reactant being $ZrF_4$;
the fluorinated reactant being $HfF_4$;
the fluorinated reactant being $VF_5$;
the fluorinated reactant being $NbF_5$;
the fluorinated reactant being $TaF_5$;
the fluorinated reactant being $MoF_6$;
the fluorinated reactant being $WF_6$;
the etching composition further comprising a solvent selected from the group consisting of THF, dimethylether, diethylether, glyme, diglyme, triglyme, polyglyme, dimethylsulphide, diethylsulphide, and methylcyanide;
the fluorinated reactant having the formula $MF_x(adduct)_n$, wherein M is an element from the Periodic Table, x ranges from 2 to 6 inclusive, n ranges from 1 to 5 inclusive, and the adduct being a neutral organic molecule selected from the group consisting of THF, dimethylether, diethylether, glyme, diglyme, triglyme, polyglyme, dimethylsulphide, diethylsulphide, and methylcyanide;
the fluorinated reactant having the formula $MF_x(adduct)_n$, wherein M is an element from Group IV of the Periodic Table (i.e., Ti, Zr, or Hf), x ranges from 2 to 6 inclusive, n ranges from 1 to 5 inclusive, and the adduct being a neutral organic molecule selected from the group consisting of THF, dimethylether, diethylether, glyme, diglyme, triglyme, polyglyme, dimethylsulphide, diethylsulphide, and methylcyanide;
the fluorinated reactant having the formula $MF_x(adduct)_n$, wherein M is an element from Group V of the Periodic Table (i.e., V, Nb, or Ta), x ranges from 2 to 6 inclusive, n ranges from 1 to 5 inclusive, and the adduct being a neutral organic molecule selected from the group consisting of THF, dimethylether, diethylether, glyme, diglyme, triglyme, polyglyme, dimethylsulphide, diethylsulphide, and methylcyanide;
the fluorinated reactant having the formula $MF_x(adduct)_n$, wherein M is Mo or W, x ranges from 2 to 6 inclusive, n ranges from 1 to 5 inclusive, and the adduct being a neutral organic molecule selected from the group consisting of THF, dimethylether, diethylether, glyme, diglyme, triglyme, polyglyme, dimethylsulphide, diethylsulphide, and methylcyanide;
the fluorinated reactant being a $TiF_4(adduct)_n$, wherein n ranges from 1 to 5 inclusive and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant being a $ZrF_4(adduct)_n$, wherein n ranges from 1 to 5 inclusive and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant being a $NbF_5(adduct)_n$, wherein n ranges from 1 to 5 inclusive and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant being a $TaF_5(adduct)_n$, n ranges from 1 to 5 inclusive and the adduct being a neutral organic molecule selected from the group consisting of THF, dimethylether, diethylether, glyme, diglyme, triglyme, polyglyme, dimethylsulphide, diethylsulphide, and methylcyanide;

the fluorinated reactant being $NbF_5(SEt_2)$;
the fluorinated reactant being $NbF_4(SEt_2)_2$;
the fluorinated reactant being $TaF_5(SEt_2)$;
the fluorinated reactant being $TaF_4(SEt_2)_2$;
the etching composition comprising between approximately 95% w/w and approximately 100% w/w of the fluorinated reactant;
the etching composition comprising between approximately 5% w/w and approximately 50% w/w of the fluorinated reactant;
the etching composition comprising between approximately 0 ppbw and approximately 500 ppbw Al;
the etching composition comprising between approximately 0 ppbw and approximately 500 ppbw As;
the etching composition comprising between approximately 0 ppbw and approximately 500 ppbw Ba;
the etching composition comprising between approximately 0 ppbw and approximately 500 ppbw Be;
the etching composition comprising between approximately 0 ppbw and approximately 500 ppbw Bi;
the etching composition comprising between approximately 0 ppbw and approximately 500 ppbw Cd;
the etching composition comprising between approximately 0 ppbw and approximately 500 ppbw Ca;
the etching composition comprising between approximately 0 ppbw and approximately 500 ppbw Cr;
the etching composition comprising between approximately 0 ppbw and approximately 500 ppbw Co;
the etching composition comprising between approximately 0 ppbw and approximately 500 ppbw Cu;
the etching composition comprising between approximately 0 ppbw and approximately 500 ppbw Ga;
the etching composition comprising between approximately 0 ppbw and approximately 500 ppbw Ge;
the etching composition comprising between approximately 0 ppbw and approximately 500 ppbw Hf;
the etching composition comprising between approximately 0 ppbw and approximately 500 ppbw Zr;
the etching composition comprising between approximately 0 ppbw and approximately 500 ppbw In;
the etching composition comprising between approximately 0 ppbw and approximately 500 ppbw Fe;
the etching composition comprising between approximately 0 ppbw and approximately 500 ppbw Pb;
the etching composition comprising between approximately 0 ppbw and approximately 500 ppbw Li;
the etching composition comprising between approximately 0 ppbw and approximately 500 ppbw Mg;
the etching composition comprising between approximately 0 ppbw and approximately 500 ppbw Mn;
the etching composition comprising between approximately 0 ppbw and approximately 500 ppbw Ni;
the etching composition comprising between approximately 0 ppbw and approximately 500 ppbw K;
the etching composition comprising between approximately 0 ppbw and approximately 500 ppbw Na;
the etching composition comprising between approximately 0 ppbw and approximately 500 ppbw Sr;
the etching composition comprising between approximately 0 ppbw and approximately 500 ppbw Th;
the etching composition comprising between approximately 0 ppbw and approximately 500 ppbw Sn;
the etching composition comprising between approximately 0 ppbw and approximately 500 ppbw Ti;
the etching composition comprising between approximately 0 ppbw and approximately 500 ppbw U;
the etching composition comprising between approximately 0 ppbw and approximately 500 ppbw Zn;
the etching composition comprising between approximately 0 ppmw and approximately 500 ppmw Cl;
the etching composition comprising between approximately 0 ppmw and approximately 500 ppmw Br;
the etching composition comprising between approximately 0 ppmw and approximately 500 ppmw I; and
the etching composition comprising between approximately 0.0% w/w and 0.1% w/w $Cl_2$.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
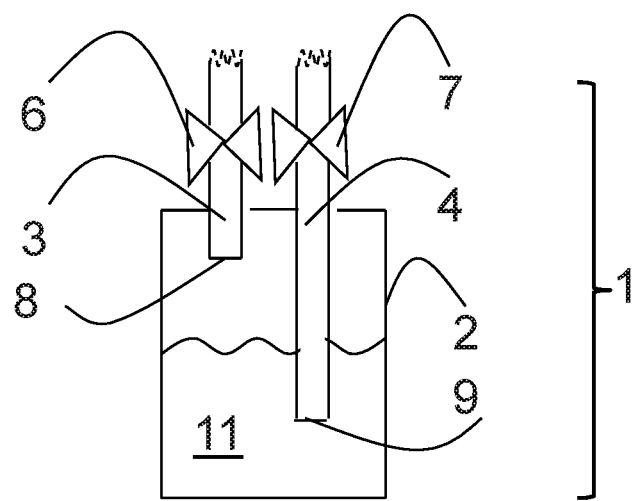
FIG. 1 is a side view of one embodiment of the fluorinated reactant delivery device disclosed herein.

Disclosed are processes of removing layers using fluorinated reactants without the use of plasma. Vapors of the fluorinated reactant are introduced into a reactor containing the layer disposed on a substrate. The vapor of the fluorinated reactant reacts with the layer and forms volatile fluorinated species. As a result, at least part of the layer is removed from the substrate.

The disclosed processes allow removal of layers without utilizing any plasma. For example, the disclosed processes may selectively etch one layer from a different layer. More particularly, the disclosed process may be useful to dry etch a $ZrO_2$ layer from an $Al_2O_3$ layer in a DRAM trench having an aspect ratio ranging from approximately 1:1 to 60:1. Alternatively, the disclosed processes may be used as cleaning processes to remove residues from deposition reactor surfaces, such as $Al_2O_3$, $SiO_2$, or stainless steel. In another alternative, the disclosed processes may selectively etch a $SiO_2$ hard mask cap layer from underlying doped polysilicon layer from the gate stack of a transistor device.

Plasma may cause damage to the substrate from which the layer is removed, particularly any sidewalls during removal of any layers in structures having a high aspect ratio. This damage may also lead to contamination of the substrate. Plasma may also suffer from non-uniformity, resulting in dead spaces where the plasma does not reach, particularly for chamber cleaning applications and etching of high aspect ratio structures. As a result, the plasma etch process may not successfully remove the entire layer from the structure being cleaned or etched. The ability to remove the layers without using a plasma process therefore provides a significant advantage over processes that use plasma.

The fluorinated reactant has the formula $MF_x(adduct)_n$, wherein M is an element from the periodic table, x ranges from 2 to 6 inclusive, and n ranges from 0 to 5 inclusive. Exemplary fluorinated reactants in which n=0 include $PF_3$, $PF_5$, $TiF_4$, $ZrF_4$, $HfF_4$, $VF_5$, $NbF_5$, $TaF_5$, $MoF_6$, $WF_6$, or combinations thereof. When M is a Group IV element (i.e., Ti, Zr, or Hf), the resulting fluorinated reactant (i.e., $TiF_4$, $ZrF_4$, or $HfF_4$) is a solid at standard temperature and pressure. When M is a Group V element (i.e., V, Nb, or Ta), the resulting fluorinated reactant is $VF_5$, $NbF_5$, or $TaF_5$. $VF_5$ is a liquid at standard temperature and pressure, while $NbF_5$ and $TaF_5$ are solids. M may also be Mo or W from is a Group VI of the Periodic Table. The resulting fluorinated reactant (i.e., $MoF_6$ and $WF_6$) is a liquid at standard temperature and pressure. One of ordinary skill in the art will recognize that vapor delivery of liquid reactants is easier than that of solid reactants, making processes using $VF_5$, $MoF_6$, and $WF_6$ interesting for the present application.

Alternatively, the fluorinated reactant has the formula $MF_x(adduct)_n$ wherein M is an element from the periodic table, x ranges from 2 to 6 inclusive, n ranges from 1 to 5 inclusive, and the adduct is a neutral organic molecule selected from THF, dimethylether, diethylether, glyme, diglyme, triglyme, polyglyme, dimethylsulphide, diethylsulphide, or methylcyanide. Exemplary fluorinated reactants include $TiF_4(adduct)_n$, $ZrF_4(adduct)_n$, $NbF_{5-n}(adduct)_n$, or $TaF_{5-n}(adduct)_n$, such as $NbF_5(SEt_2)$, $NbF_4(SEt_2)_2$, $TaF_5(SEt_2)$, and $TaF_4(SEt_2)_2$. For solid fluorinated reactants, addition of the adduct may help alter the reactant's phase from solid to liquid at standard temperature and pressure which, as discussed above, is beneficial for vapor delivery, making the adducted fluorinated reactants well suited for chamber cleaning applications. However, use of the adducted reactants may prove contamination issues for etching of high aspect ratio structures.

The disclosed fluorinated reactants having the formula $MF_x$, where M is an element from the periodic table and x ranges from 2 to 6 inclusive, are commercially available. For example, Sigma-Aldrich currently sells $TiF_4$, $ZrF_4$, $HfF_4$, $NbF_5$, $TaF_5$, and $WF_6$ and Advance Research Chemicals, Inc. currently sells $VF_5$ and $MoF_6$. The disclosed fluorinated reactant $MF_x(adduct)_n$ may be prepared according to the procedure described in Journal of the Less-Common Metals, 61 (1978) 1-30, by mixing the corresponding fluorinated reactant $MF_x$ in the appropriate adduct solvent. One of ordinary skill in the art will recognize that mixing the fluorinated reactant $MF_x$ in a solvent may produce an adduct or a solution, depending on the reactant and the solvent.

Preferred fluorinated reactants enjoy a weak M-F bond, which makes dissociation of free F radicals easier, and readily react with the substrate to produce volatile fluorinated species that may be removed from the reactor. The solid $NbF_5$, $TaF_5$, $TiF_4$, $ZrF_4$, or $HfF_4$ reactants may be used in the disclosed processes at elevated temperatures (ranging from approximately 30° C. to approximately 150° C. inclusive) in order to deliver the vapor. The liquid $VF_5$, $MoF_6$, and $WF_6$ may be used at lower temperatures (ranging from the freezing point of the reactant to approximately 150° C. inclusive). Preferably, the fluorinated reactant is $VF_5$, $NbF_5$, $TaF_5$, $MoF_6$, $WF_6$, $NbF_5(SEt_2)$, or $TaF_5(SEt_2)$, and more preferably $NbF_5$ or $TaF_5$.

The purity of the disclosed fluorinated reactants is preferably higher than 90% w/w. For etching applications, particularly high aspect ratio etching applications, the purity of the disclosed fluorinated reactants may be higher than 99.9% w/w to prevent contamination issues, and preferably higher than 99.99% w/w. The disclosed etching fluorinated reactants may contain any of the following impurities: chlorine, bromide, iodine, moisture ($H_2O$), hydrogen fluoride (HF), hydrogen chloride (HF), hydrogen bromide (HF), hydrogen iodide (HF) or other organic and inorganic impurities. Preferably, the total quantity of each of these impurities is below 0.1% w/w. Such impurities might be removed by sublimation, distillation, or recrystallization in a suitable solvent or any other suitable purification method. Suitable solvents for recrystallization may be selected from THF, benzene, toluene, xylene, dimethylether, diethylether, dichloromethane, trichloromethane, tetrachloromethane, glyme, diglyme, triglyme, polyglyme, dimethylsulphide, diethylsulphide, or methylcyanide.

The disclosed fluorinated reactants may also include metal or metalloid impurities at the ppbw (part per billion weight) level. These metal or metalloid impurities include but are not limited to Lithium (Li), Beryllium (Be), Sodium (Na), Magnesium (Mg), Aluminum (Al), Silicon (Si), Potassium (K), Calcium (Ca), Scandium (Sc), Titanium (Ti), Vanadium (V), Chromium (Cr), Manganese (Mn), Iron (Fe), Cobalt (Co), Nickel (Ni), Copper (Cu), Zinc (Zn), Gallium (Ga), Germanium (Ge), Arsenic (As), Strontium (Sr), Yttrium (Y), Zirconium (Zr), Niobium (Nb), Molybdenum (Mo), Ruthenium (Ru), Rhodium (Rh), Palladium (Pd), Silver (Ag), Cadmium (Cd), Indium (In), Tin (Sn), Antimony (Sb), Tellurium (Te), Cesium (Cs), Barium (Ba), Lutetium (Lu), Hafnium (Hf), Tantalum (Ta), Tungsten (W), Rhenium (Re), Osmium (Os), Iridium (Ir), Platinum (Pt), Gold (Au), Mercury (Hg), Thallium (Tl), Lead (Pb), Bismuth (Bi), Lanthanum (La), Cerium (Ce), Praseodymium (Pr), Neodymium (Nd), Samarium (Sm), Europium (Eu), Gadolimium (Gd), Dysprosium (Dy), Erbium (er), and/or Ytterbium (Yb).

Vapors of the disclosed fluorinated reactant are used to remove layers from substrates without utilizing any plasma process. These processes may be useful in the manufacture of semiconductor, photovoltaic, LCD-TFT, or flat panel devices. The disclosed fluorinated reactants may be used to remove the layers using any dry etching methods known to those of skill in the art. For instance, the etching methods may occur in a low pressure thermal reactor having a substrate disposed therein. Alternatively, the disclosed fluorinated reactants may be used in an atomic layer etching process which controls the etch rate at the atomic scale (unlike atomic layer deposition, atomic layer etching is not a self limiting reaction). In either alternative, the underlying substrate may be the reactor materials, such as the reactor walls, or a wafer having one or more layers thereon.

A substrate is generally defined as the material on which a process is conducted. The substrate may be the internal parts of the reactor, such as the reactor walls. Alternatively, the substrate may be a wafer, such as a silicon, silicon carbide, silica, glass, GaAs, or GaN wafer. The reactor may contain from 1 to 200 silicon wafers having from 25.4 mm to 450 mm diameters. The wafer may have one or more layers of differing materials deposited on it from a previous manufacturing step, including the layer to be removed. For example, the wafers may include silicon layers (crystalline, amorphous, porous, etc.), silicon carbide layers, silicon oxide layers, silicon nitride layers, silicon oxy nitride layers, carbon doped silicon oxide (SiCOH) layers, or combination thereof. Additionally, the wafers may include GaN layers, aluminum layers, copper layers, tungsten layers, or noble metal layers (e.g., platinum, palladium rhodium, or gold). Plastic layers, such as poly(3,4-ethylenedioxythiophene) poly (styrenesulfonate) [PEDOT:PSS], may also be used. The layers may be planar or patterned. The disclosed processes may etch the single layer directly or etch more than one (when patterned layers from the substrate) of the layers on top of the wafer. Furthermore, one of ordinary skill in the art will recognize that the terms "film" or "layer" used herein refer to a thickness of some material laid on or spread over a surface and that the surface may be a trench or a line that does not cover the entire wafer or reactor surface. Throughout the specification and claims, the reactor or wafer and any associated layers thereon are referred to as substrates. For example, a $SiO_2$ layer on top of a silicon wafer.

The layer may be a metal layer, a nitride layer, an oxide layer, or combinations thereof.

Exemplary metal layers include Scandium (Sc), Titanium (Ti), Vanadium (V), Chromium (Cr), Manganese (Mn), Iron (Fe), Cobalt (Co), Nickel (Ni), Copper (Cu), Zinc (Zn), Gallium (Ga), Germanium (Ge), Arsenic (As), Selenium (Se), Strontium (Sr), Yttrium (Y), Zirconium (Zr), Niobium (Nb), Molybdenum (Mo), Ruthenium (Ru), Rhodium (Rh), Palladium (Pd), Silver (Ag), Cadmium (Cd), Indium (In), Tin (Sn), Antimony (Sb), Tellurium (Te), Cesium (Cs), Barium (Ba), Hafnium (Hf), Tantalum (Ta), Tungsten (W), Rhenium (Re), Osmium (Os), Iridium (Ir), Platinum (Pt), Gold (Au), Mercury (Hg), Thallium (Tl), Lead (Pb), Bismuth (Bi), Lanthanum (La), Cerium (Ce), Praseodymium (Pr), Neodymium (Nd), Samarium (Sm), Europium (Eu), Gadolimium (Gd), Dysprosium (Dy), Erbium (Er), Ytterbium (Yb), and/or Lutetium (Lu).

Exemplary oxide layers include Scandium oxide ($Sc_2O_3$), Titanium oxide ($TiO_2$), Vanadium oxide ($VO_2$, $V_2O_3$, $V_2O_5$), Chromium oxide ($CrO$, $CrO_2$, $CrO_3$, $CrO_5$, $Cr_8O_{21}$), Manganese oxide ($MnO$, $Mn_3O_4$, $Mn_2O_3$, $MnO_2$, $Mn_2O_7$), Iron oxide ($FeO_2$, $Fe_2O_3$, $Fe_3O_4$, $Fe_4O_5$), Cobalt oxide ($CoO$, $Co_2O_3$, $Co_3O_4$), Nickel oxide ($NiO$, $Ni_2O_3$), Copper oxide ($CuO$, $Cu_2O$), Zinc oxide ($ZnO$), Gallium oxide ($Ga_2O_3$, $GaO$, $GaO_2$), Germanium oxide ($GeO_2$), Strontium oxide ($SrO$), Yttrium oxide ($Y_2O_3$), Zirconium oxide ($ZrO_2$), Niobium oxide ($Nb_2O_5$), Molybdenum oxide ($MoO_2$, $MoO_3$), Ruthenium oxide ($RuO_2$), Rhodium oxide ($Rh_2O_3$), Palladium oxide ($PdO$), Silver oxide ($Ag_2O$), Cadmium oxide ($CdO$), Indium oxide ($In_2O_3$), Tin oxide ($SnO$, $SnO_2$), Antimony oxide ($SbsO_3$), Tellurium oxide ($TeO_2$), Cesium oxide ($Cs_{11}O_3$, $Cs_4O$, $Cs_7O$, $Cs_2O$), Barium oxide ($BaO$), Lutetium oxide ($Lu_2O_3$), Hafnium oxide ($HfO_2$), Tantalum oxide ($Ta_2O_5$), Tungsten oxide ($W_2O_3$, $WO_2$, $WO_3$, $W_2O_5$), Rhenium oxide ($Rh_2O_7$, $RhO_2$, $RhO_3$), Osmium oxide ($OsO_2$, $OsO_4$), Iridium oxide ($IrO_2$), Platinum oxide ($PtO_2$), Gold oxide ($Au_2O_3$), Bismuth oxide ($Bi_2O_3$), Lanthanum oxide ($La_2O_3$), Cerium oxide ($Ce_2O_3$), Praseodymium oxide ($Pr_2O_3$), Neodymium oxide ($Nd_2O_3$), Gadolimium oxide ($Gd_2O_3$), Dysprosium oxide ($Dy_2O_3$), Erbium oxide ($Er_2O_3$), or Ytterbium oxide ($Yb_2O_3$).

Exemplary nitride layers include Titanium nitride ($TiN_x$), Tantalum nitride ($TaN_x$), Silicon nitride ($SiN_x$), Vanadium nitride ($VN_x$), Tungsten nitride ($WN_x$), Molybdenum nitride ($MoN_x$), Chromium nitride ($CrN_x$), Hafnium nitride ($HfN_x$), Zirconium nitride ($ZrN_x$), Germanium nitride ($GeN_x$), Manganese nitride ($MnN_x$), Nickel nitride ($NiN_x$). One skilled in the art will recognize that nitride encompasses carbonitrides, of formula $MC_xN_y$, wherein M is a Si, Ge, or a transition metal element and x and y are comprised between 0 and 12 and silicocarbonitrides, of formula $MSi_xC_yN_z$, wherein M is a Ge or a transition metal and x, y and z are comprised between 0 and 12 inclusive.

The oxide layer may also be a binary or ternary oxide layer. For example, the oxide layer can be strontium titanate ($SrTiO_x$), barium titanate ($BaTiO_x$), hafnium zirconium oxide ($HfZrO_x$), hafnium titanate ($HfTiO_x$), hafnium yttrium oxide ($HfYO_x$), zirconium yttrium oxide ($ZrYO_x$), titanium aluminate ($TiAlO_x$), zirconium erbium oxide ($ZrErO_x$), zirconium lanthanum oxide ($ZrLaO_x$), zirconium dysprosium oxide ($ZrDyO_x$), hafnium dysprosium oxide ($HfDyO_x$), hafnium lanthanum oxide ($HfLaO_x$), titanium erbium oxide ($TiErO_x$), or titanium yttrium oxide ($TiYO_x$), wherein x is as defined above.

The layer may also be a stack of different layers, such as for example $HfO_2/Al_2O_3$ nanolaminates. More preferably the oxide layer is selected from the group consisting of Titanium oxide ($TiO_2$), Zirconium oxide ($ZrO_2$), Hafnium oxide ($HfO_2$), Niobium oxide ($Nb_2O_5$), Molybdenum oxide ($MoO_2$, $MoO_3$), and Tantalum oxide ($Ta_2O_5$).

The vapors of the fluorinated reactants are introduced into the reactor containing a substrate having the layer thereon. The vapors of the fluorinated reactants may be introduced to the reactor at a flow rate ranging from approximately 0.1 sccm to approximately 1 slm to produce a total pressure in the reactor ranging from approximately 0 Torr to approximately 500 Torr. The vapors may be diluted by a carrier gas, such as $N_2$, Ar or Kr. For example, for a 200 mm wafer size, the fluorinated reactant's vapors may be introduced to the chamber at a flow rate ranging from approximately 0.1 sccm to approximately 200 sccm inclusive. Alternatively, for a 450 mm wafer size, the fluorinated reactant's vapors may be introduced to the chamber at a flow rate ranging from approximately 100 sccm to approximately 600 sccm inclusive. One of ordinary skill in the art will recognize that the flow rate will vary from tool to tool. In one alternative, the fluorinated reactant's vapors may be continuously introduced into chamber. In another alternative, the fluorinated reactant's vapors are sequentially introduced into chamber i.e., introduced by pulses alternated by purge sequences (which is sometimes referred to as Atomic Layer Etching).

The fluorinated reactants are introduced into a reactor in vapor form by conventional means, such as tubing and/or flow meters. The vapor form of the reactant may be produced by vaporizing the reactant through a conventional vaporization step such as direct vaporization, distillation, direct liquid injection, by bubbling, or by using a sublimator such as the one disclosed in PCT Publication WO2009/087609 to Xu et al. The reactants may be fed in liquid state to a vaporizer where it is vaporized before it is introduced into the reactor. Alternatively, the reactants may be vaporized by passing a carrier gas into a container containing the reactant or by bubbling the carrier gas into the reactant. The carrier gas may include, but is not limited to, Ar, He, $N_2$, and mixtures thereof. Bubbling with a carrier gas may also remove any dissolved oxygen present in the reactant. The carrier gas and reactant are then introduced into the reactor as a vapor.

If necessary, the container of the disclosed fluorinated reactants may be heated to a temperature that permits the reactant to be in its liquid phase and/or to have a sufficient vapor pressure. The container may be maintained at temperatures in the range of, for example, approximately 0° C. to approximately 150° C. inclusive. Those skilled in the art recognize that the temperature of the container may be adjusted in a known manner to control the amount of reactant vaporized.

Figure 2:
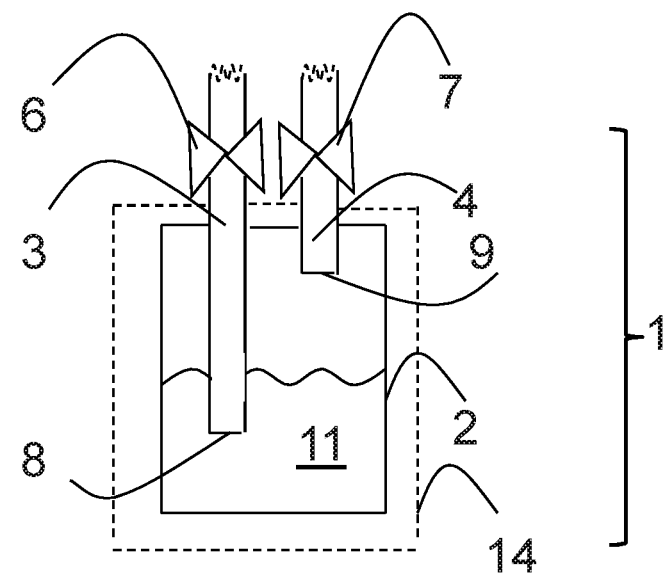
FIG. 2 is a side view of a second embodiment of the fluorinated reactant delivery device disclosed herein.
Figure 3:
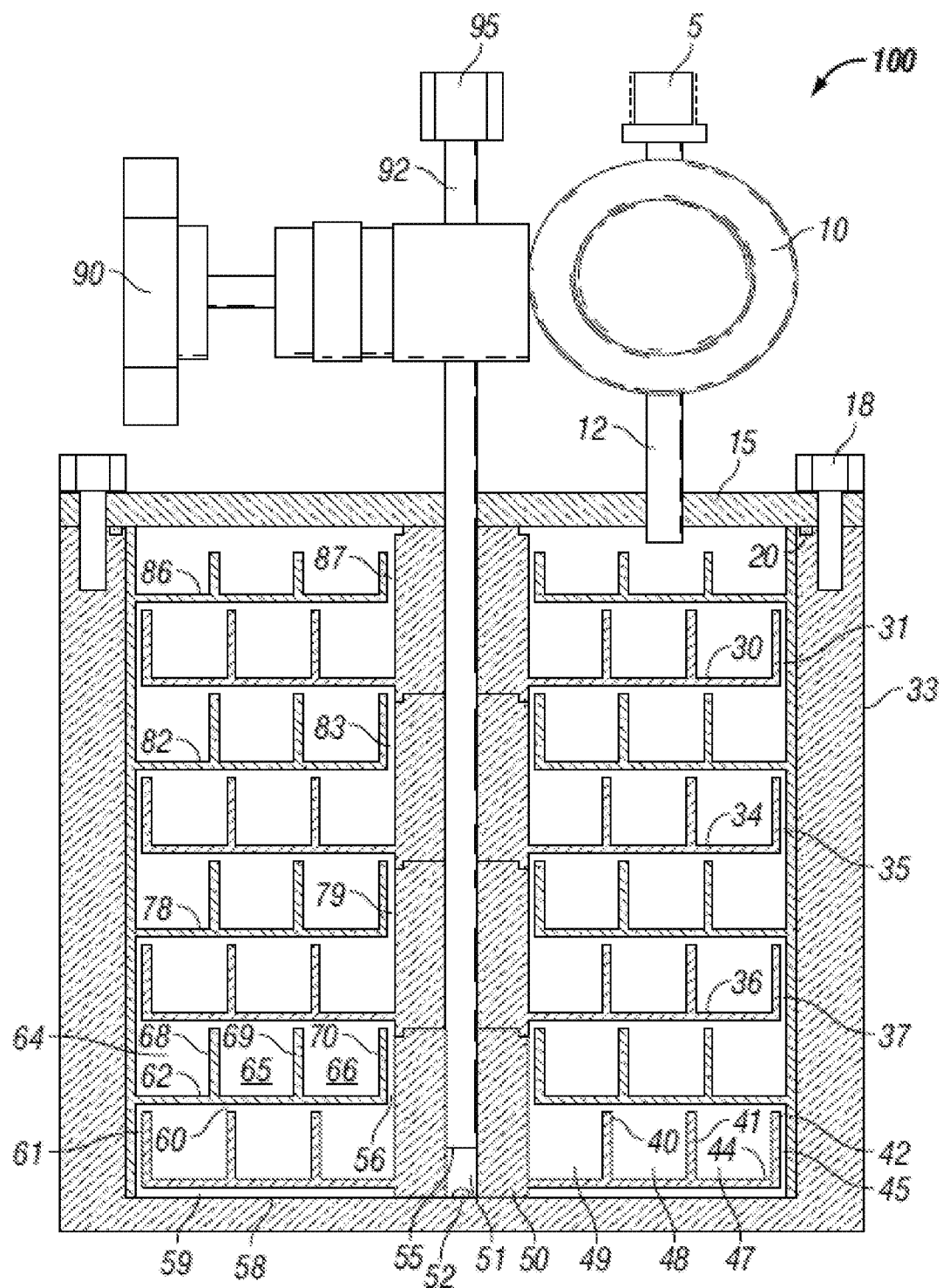
FIG. 3 is an exemplary embodiment of a solid precursor sublimator for subliming solid fluorinated reactants.

The fluorinated reactants may be delivered to the reactor by the fluorinated reactant delivery devices of FIGS. 1-3, which show three exemplary embodiments of fluorinated reactant delivery devices.

FIG. 1 is a side view of one embodiment of the fluorinated reactant delivery device 1. In FIG. 1, the disclosed fluorinated reactants 11 are contained within a container 2 having two conduits, an inlet conduit 3 and an outlet conduit 4. One of ordinary skill in the reactant art will recognize that the container 2, inlet conduit 3, and outlet conduit 4 are manufactured to prevent the escape of the gaseous form of the fluorinated reactant 11, even at elevated temperature and pressure.

The delivery device 1 fluidly connects to the reactor (not shown) or other components between the delivery device and the reactor, such as a gas cabinet, via valves 6 and 7. Preferably, the container 2, inlet conduit 3, valve 6, outlet conduit 4, and valve 7 are made of 316 L EP or 304 stainless steel. However, one of ordinary skill in the art will recognize that other non-reactive materials may also be used in the teachings herein and that any corrosive fluorinated reactant 11 may require the use of more corrosion-resistant materials, such as a nickel-based alloy sold for example under the trademark Hastelloy® by Haynes International, Inc. or under the trademark Inconel® by Huntington Alloys Corporation. Alternatively, the parts exposed to the fluorinating reactant 11, and especially to storage vessels containing the fluorinating reactant 11, may be coated with fluoride resistant coatings, such as but not limited to nickel, diamond like carbon, perfluorinated carbon, alumina, silicon carbide and carbonitride, metal carbide, etc. and multilayers thereof.

In FIG. 1, the end 8 of inlet conduit 3 is located above the surface of the fluorinated reactant 11, whereas the end 9 of the outlet conduit 4 is located below the surface of the fluorinated reactant 11. In this embodiment, the fluorinated reactant 11 is preferably in liquid form. An inert gas, including but not limited to nitrogen, argon, helium, and mixtures thereof, may be introduced into the inlet conduit 3. The inert gas pressurizes the delivery device 2 so that the liquid fluorinated reactant 11 is forced through the outlet conduit 4 and to the reactor (not shown). The reactor may include a vaporizer which transforms the liquid fluorinated reactant 11 into a vapor, with or without the use of a carrier gas such as helium, argon, nitrogen or mixtures thereof, in order to deliver the vapor to the substrate on which the oxide film is located.

FIG. 2 is a side view of a second embodiment of the fluorinated reactant delivery device 1. In FIG. 2, the end 8 of inlet conduit 3 is located below the surface of the fluorinated reactant 11, whereas the end 9 of the outlet conduit 4 is located above the surface of the fluorinated reactant 11. FIG. 2 also includes an optional heating element 14, which may increase the temperature of the fluorinated reactant 11. In this embodiment, the fluorinated reactant 11 may be in solid or liquid form. An inert gas, including but not limited to nitrogen, argon, helium, and mixtures thereof, is introduced into the inlet conduit 3. The inert gas bubbles through the fluorinated reactant 11 and carries a mixture of the inert gas and vaporized fluorinated reactant 11 to the outlet conduit 4 and on to the reactor.

FIGS. 1 and 2 include valves 6 and 7. One of ordinary skill in the art will recognize that valves 6 and 7 may be placed in an open or closed position to allow flow through conduits 3 and 4, respectively. Either delivery device 1 in FIGS. 1 and 2, or a simpler delivery device having a single conduit terminating above the surface of any solid or liquid present, may be used if the fluorinated reactant 11 is in vapor form or if sufficient vapor pressure is present above the solid/liquid phase. In this case, the fluorinated reactant 11 is delivered in vapor form through the conduit 3 or 4 simply by opening the valve 6 in FIG. 1 or 7 in FIG. 2. The delivery device 1 may be maintained at a suitable temperature to provide sufficient vapor pressure for the fluorinated reactant 11 to be delivered in vapor form, for example by the use of an optional heating element 14.

While FIGS. 1 and 2 disclose two embodiments of the fluorinated reactant delivery device 1, one of ordinary skill in the art will recognize that the inlet conduit 3 and outlet conduit 4 may also both be located above or below the surface of the fluorinated reactant 11 without departing from the disclosure herein. Furthermore, inlet conduit 3 may be a filling port. For example, for the solid $NbF_5$ R&D examples that follow, the delivery device 1 included both an inlet conduit 3 and outlet conduit 4 located above the surface of the fluorinated reactant 11. The carrier gas flows through the inlet conduit 3, above the surface of the solid fluorinated reactant 11, and the mixture of the vapor of the fluorinated reactant 11 and carrier gas exit the delivery device 1 via the outlet conduit 4. In contrast, the vapor of the liquid $VF_5$ and $MoF_6$ was produced using a vacuum and single outlet conduit 4 located above the surface of the liquid fluorinated reactant 11.

Solid forms of the fluorinated reactant may also be delivered to the reactor using a sublimator. FIG. 3 shows one embodiment of an exemplary sublimator 100. The sublimator 100 comprises a container 33. Container 33 may be a cylindrical container, or alternatively, may be any shape, without limitation. The container 33 is constructed of materials such as stainless steel, nickel and its alloys, quartz, glass, and other chemically compatible materials, without limitation. In certain instances, the container 33 is constructed of another metal or metal alloy, without limitation. In certain instances, the container 33 has an internal diameter from about 8 centimeters to about 55 centimeters and, alternatively, an internal diameter from about 8 centimeters to about 30 centimeters. As understood by one skilled in the art, alternate configurations may have different dimensions.

Container 33 comprises a sealable top 15, sealing member 18, and gasket 20. Sealable top 15 is configured to seal container 33 from the outer environment. Sealable top 15 is configured to allow access to the container 33. Additionally, sealable top 15 is configured for passage of conduits into container 33. Alternatively, sealable top 15 is configured to permit fluid flow into container 33. Sealable top 15 is configured to receive and pass through a conduit comprising a dip tube 92 to remain in fluid contact with container 33. Dip tube 92 having a control valve 90 and a fitting 95 is configured for flowing carrier gas into container 33. In certain instances, dip tube 92 extends down the center axis of container 33. Further, sealable top 15 is configured to receive and pass through a conduit comprising outlet tube 12. The carrier gas and vapor of the fluorinated reactant is removed from container 33 through the outlet tube 12. Outlet tube 12 comprises a control valve 10 and fitting 5. In certain instances, outlet tube 12 is fluidly coupled to a gas delivery manifold, for conducting carrier gas from the sublimator 100 to the reactor.

Container 33 and sealable top 15 are sealed by at least two sealing members 18; alternatively, by at least about four sealing members. In certain instance, sealable top 15 is sealed to container 33 by at least about eight sealing members 18. As understood by one skilled in the art, sealing member 18 releasably couples sealable top 15 to container 33, and forms a gas resistant seal with gasket 20. Sealing member 18 may comprise any suitable means known to one skilled in the art for sealing container 33. In certain instances, sealing member 18 comprises a thumbscrew.

As illustrated in FIG. 3, container 33 further comprises at least one disk disposed therein. The disk comprises a shelf, or horizontal support, for solid material. In certain embodiments, an interior disk 30 is disposed annularly within the container 33, such that the disk 30 includes an outer diameter or circumference that is less than the inner diameter or circumference of the container 33, forming an opening 31. An exterior disk 86 is disposed circumferentially within the container 33, such that the disk 86 comprises an outer diameter or circumference that is the same, about the same, or generally coincides with the inner diameter of the container 33. Exterior disk 86 forms an opening 87 disposed at the center of the disk. A plurality of disks is disposed within container 33. The disks are stacked in an alternating fashion, wherein interior disks 30, 34, 36, 44 are vertically stacked within the container with alternating exterior disks 62, 78, 82, 86. In embodiments, interior disks 30, 34, 36, 44 extend annularly outward, and exterior disks 62, 78, 82, 86 extend annularly toward the center of container 33. As illustrated in the embodiment of FIG. 3, interior disks 30, 34, 36, 44 are not in physical contact with exterior disks 62, 78, 82, 86.

The assembled sublimator 100 comprises interior disks 30, 34, 36, 44 comprising aligned and coupled support legs 50, interior passage 51, concentric walls 40, 41, 42, and concentric slots 47, 48, 49. The interior disks 30, 34, 36, 44 are vertically stacked, and annularly oriented about the dip tube 92. Additionally, the sublimator comprises exterior disks 62, 78, 82, 86. As illustrated in FIG. 3, the exterior disks 62, 78, 82, 86 should be tightly fit into the container 33 for a good contact for conducting heat from the container 33 to the disks 62, 78, 82, 86. Preferably, the exterior disks 62, 78, 82, 86 are coupled to, or in physical contact with, the inner wall of the container 33.

As illustrated, exterior disks 62, 78, 82, 86 and interior disks 30, 34, 36, 44 are stacked inside the container 33. When assembled in container 33 to form sublimator 100, the interior disks 30, 34, 36, 44 form outer gas passages 31, 35, 37, 45 between the assembled exterior disks 62, 78, 82, 86. Further, exterior disks 62, 78, 82, 86 form inner gas passages 56, 79, 83, 87 with the support legs of the interior disks 30, 34, 36, 44. The walls 40, 41, 42 of interior disks 30, 34, 36, 44 form the grooved slots for holding solid precursors. Exterior disks 62, 78, 82, 86 comprise walls 68, 69, 70 for holding solid precursors. During assembly, the solid precursors are loaded into the annular slots 47, 48, 49 of interior disks 30, 34, 36, 44 and annular slots 64, 65, 66 of exterior disks 62, 78, 82, 86.

While FIG. 3 discloses one embodiment of a sublimator capable of delivering the vapor of any solid fluorinated reactant to the reactor, one of ordinary skill in the art will recognize that other sublimator designs may also be suitable, without departing from the teachings herein. Finally, one of ordinary skill in the art will recognize that the disclosed fluorinated reactant may be delivered to semiconductor processing tools using other delivery devices, such as the ampoules disclosed in WO 2006/059187 to Jurcik et al., without departing from the teachings herein.

The reactor may be any enclosure or chamber within a device in which deposition methods take place such as without limitation, a furnace, a parallel-plate type reactor, a cold-wall type reactor, a hot-wall type reactor, a single-wafer reactor, a multi-wafer reactor (i.e., a furnace), or other types of deposition systems under conditions suitable to cause the reactants to react with the oxide layers and form volatile fluorinated species.

Material compatibility tests are important to determine if any of the fluorinated reactants will react with the chamber materials and degrade its performance with short term or long term use. Key materials involved in parts of chamber, valves, etc. include Stainless Steel, Aluminum, Nickel, PCTFE, PVDF, PTFE and other metals and polymers. At times these materials are exposed to higher temperatures and pressures which may enhance their degradation. The metrology methods may include visual inspection, weight measurement, measuring nanometer scale changes in SEM, tensile strength, hardness, etc. As shown in the Examples that follow, $NbF_5$ did not etch typical chamber materials, such as $Al_2O_3$ and $SiO_2$. This is surprising because, as discussed in the background, it is well known that $NbCl_5$ reacts with the silica sidewalls of the reactor (Surface and Coatings Technology, 260, 2014, pp. 126-132).

The temperature and the pressure within the reactor are held at conditions suitable for thermal etching. In other words, after introduction of the vapors of the fluorinated reactant into the chamber, conditions within the chamber are such that at least part of the layer is etched. One of ordinary skill in the art will recognize that "at least part of the layer is etched" means that some or all of the layer reacts with the fluorinated reactant to form a volatile fluorinated species. For instance, the pressure in the reactor may be held between about 1 Pa and about $10^5$ Pa, more preferably between about 25 Pa and about $10^3$ Pa, as required per the etching parameters. Likewise, the temperature in the reactor may be held between about 50° C. and about 500° C., preferably between about 100° C. and about 400° C. One of ordinary skill in the art will recognize that "at least part of the layer is etched" means that some or all of the layer is removed.

The temperature of the reactor may be controlled by either controlling the temperature of the substrate holder or controlling the temperature of the reactor wall. Devices used to heat the substrate are known in the art. The reactor wall is heated to a sufficient temperature to etch at a sufficient etching rate and with desired selectivity. A non-limiting exemplary temperature range to which the reactor wall may be heated includes from approximately 100° C. to approximately 500° C. When a thermal process is performed, the etching temperature may range from approximately 100° C. to approximately 500° C.

An inert gas may also be introduced into the reactor. The inert gas may be He, Ar, Xe, Kr, Ne, or combinations thereof. The vapor of the fluorinated reactant and the inert gas may be mixed prior to introduction to the reactor, with the inert gas comprising between approximately 50% v/v and approximately 95% v/v of the resulting mixture. Alternatively, the inert gas may be introduced to the reactor continuously while the vapor of the fluorinated reactant is introduced to the reactor in pulses.

The etching conditions within the reactor allow the disclosed fluorinated reactant and the layer to react and form volatile fluorinated species. Applicants believe that fluorinated species are sufficiently volatile to be evacuated from the reactor. For instance Niobium fluoride ($NbF_5$) may react with Niobium oxide ($Nb_2O_5$) to form the volatile Niobium oxy-fluoride ($Nb(=O)F_3$) according to the equation $3NbF_5$ (gas)+$Nb_2O_5$ (solid)→$Nb(=O)F_3$ (gas). In another example Niobium fluoride ($NbF_5$) may react with Zirconium oxide ($ZrO_2$) to form the volatile Zirconium fluoride ($ZrF_4$) according to the equation $2NbF_5$ (gas)+$ZrO_2$ (solid)→$ZrF_4$ (gas)+$2Nb(=O)F_3$ (gas). Niobium fluoride may also react with Zirconium oxide ($ZrO_2$) to form volatile Zirconium oxyfluorides ($ZrO_xF_y$, wherein x=0-2 inclusive and y=0-4 inclusive). Applicants believe that the other fluorinated precursors will react in the same or a similar manner.

One of ordinary skill in the art will recognize that the end of the etch process disclosed herein occurs when the layer is completely etched. This may be determined by placing an etch stop layer under the layer to be etched or by timing the etch process. Alternatively or additionally, the exhaust may also be monitored for the quantity of volatile fluorinated species using quadrupole mass spectrometry (QMS). A decrease in the number of volatile fluorinated species in the QMS analysis indicates that reaction between the fluorinated reactant and layer is slowing and approaching the end of the process.

Depending on the layer to be removed, the vapor of an additional fluorinated reactant may be introduced into the reactor. The additional reactant may be used to provide additional specific etching properties, such as selective etching. The additional fluorinated reactant may include a combination of the disclosed reactants or addition of other known fluorinated etch gases, such as $XeF_2$.

The fluorinated reactant may be introduced cyclically into the reactor. More particularly, a pulse of the vapor of the fluorinated reactant may be delivered concurrently with or followed by introduction of an inert gas, resulting in a reactant-inert gas 2-step cycle. This type of introduction allows control of the per-cycle etching thickness of the etched layer, sometimes referred to as atomic layer etching.

Alternatively, the vapors of different fluorinated reactants may be introduced sequentially. For instance, in a first step the vapor of $NbF_5$ is introduced and reacted with the layer. In a second step, any excess $NbF_5$ and reacted species are purged using an inert gas, such as $N_2$ or Ar. In a third step, the pulse of another fluorinated reactant, such as $ZrF_4$, is introduced. In a fourth step, any excess $ZrF_4$ and reacted species are purged using a carrier gas such as $N_2$ or Ar. Steps 1 to 4 are then repeated to allow precise control of the etched thickness.

The disclosed processes may be used to remove sacrificial metal oxide hard masks in Logic, Flash, and DRAM devices; gate oxides in Logic devices; blocking oxides in Flash devices; lithography masks; MIM capacitor structures in Logic; and oxide deposits on chamber walls.

Figure 8:
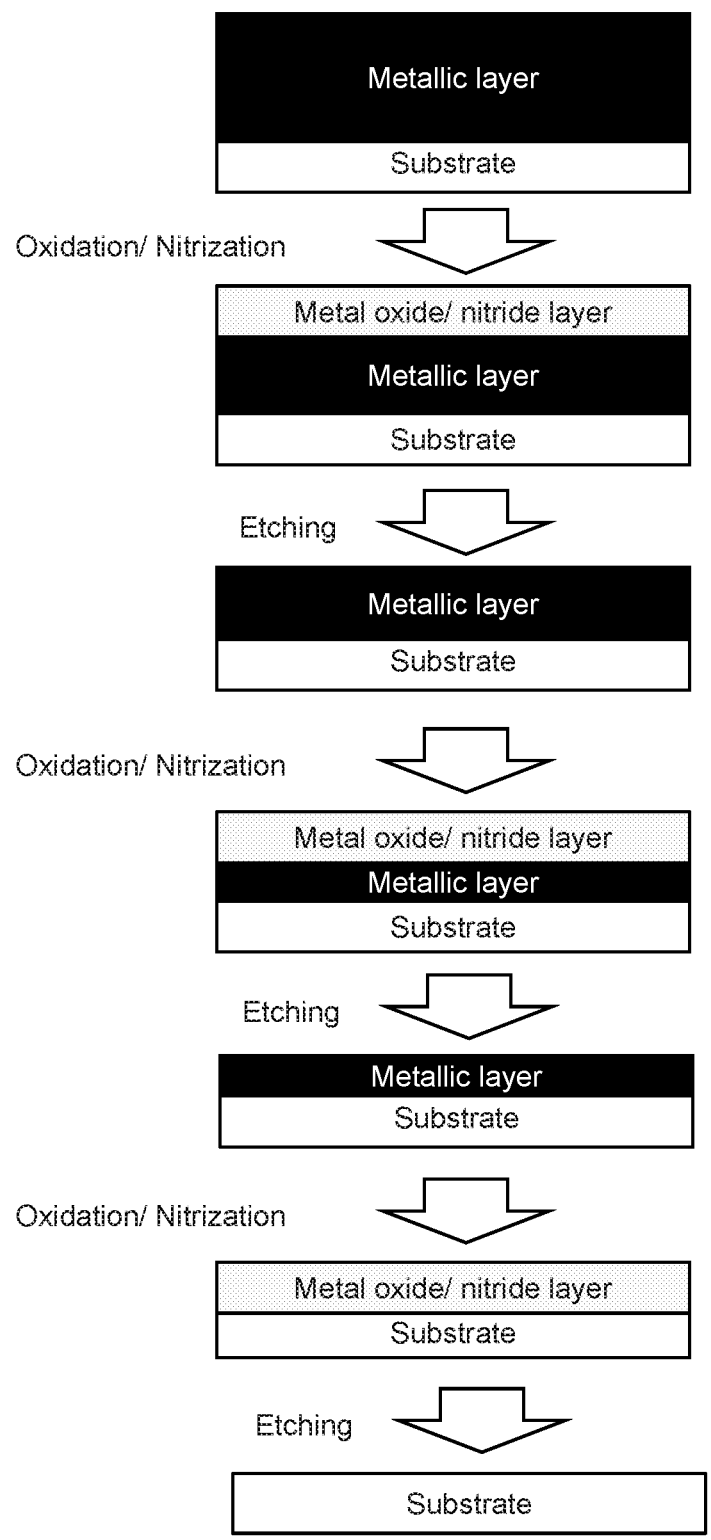
FIG. 8 is a flow chart providing the sequence for the sequential etching of a metal film by sequential oxidation of the metal film and selective removal of the oxidized portion of the film.

For metal layers, such as tungsten, molybdenum, tantalum, niobium, vanadium, hafnium, zirconium, titanium, or combinations thereof, the disclosed etching processes may be preceded by an oxidation step. FIG. 8 is a flow chart providing the sequence for the sequential etching of a metal film by sequential oxidation/nitridization of the metal film and selective removal of the oxidized/nitrized portion of the film. More particularly, as shown in FIG. 8, a metallic or metal layer on a substrate may be subject to oxidation or nitridization to form a metal oxide or metal nitride layer on top of the metallic layer. One of ordinary skill in the art will recognize the oxygen- or nitrogen-containing reactant needed to perform the oxidation or nitridization process, respectively. For example, $O_2$, CO, $CO_2$, NO, $N_2O$, $NO_2$, radical species thereof, or mixtures thereof may be used to oxidize the metal layer. Alternatively, $NH_3$, $N_2H_4$, $N(SiH_3)_3$, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$, $(CH_3)HNNH_2$, $(CH_3)_2NNH_2$, nitrogen-containing radical species thereof, and mixtures thereof may be used to nitridize the metal layer. The oxidation or nitridization step may result in the entire metal layer being oxidized or nitridized, particularly when the metal layer has a thickness ranging from approximately 0.2 nm to approximately 200 nm inclusive. Alternatively, the oxidation or nitridization step may only oxidize or nitridize the top surface of the metal layer. The metal oxide or metal nitride layer may then be removed using the disclosed fluorinated reactants. The oxidation/nitridization step and etching process may be repeated until the entire metal layer is removed.

EXAMPLES

The following non-limiting examples are provided to further illustrate embodiments of the invention. However, the examples are not intended to be all inclusive and are not intended to limit the scope of the inventions described herein.

Figure 4:
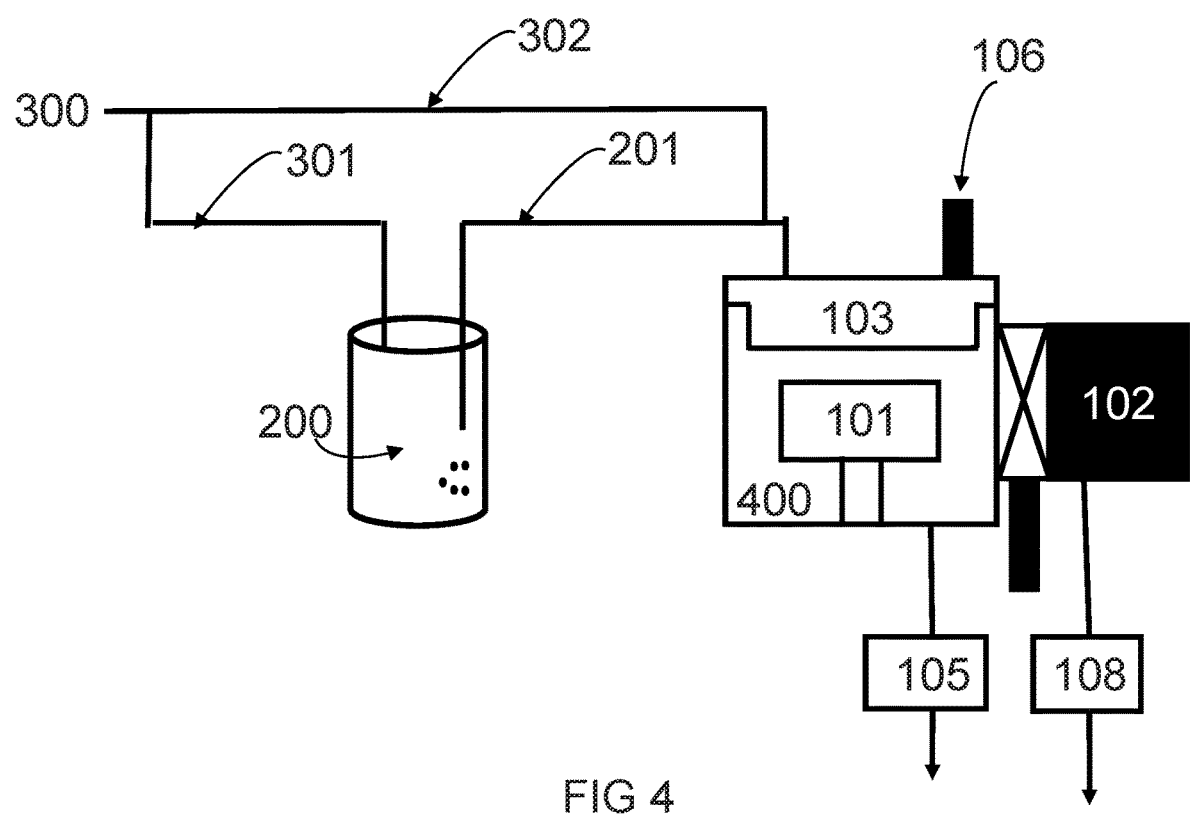
FIG. 4 is a schematic diagram of the apparatus used in Examples 1-6.

FIG. 4 is a schematic diagram of the apparatus used for the testing of Examples 1-6. The apparatus includes a reactor 400 containing a wafer stage 101. The walls of the reactor 400 were heated to 120° C. The wafer stage 101 was heated to the temperatures specified in the examples that follow. The wafer is transferred to the wafer stage 101 by load lock chamber 102, which is connected to pump 108. A showerhead 103 is located in the top of the reactor 400, and plasma may be generated by the RF generator 106. However, no plasma was used in Examples 1-6. A dry pump 105 removes the contents of the reactor 400.

The fluorinated reactant is introduced to the reactor 400 from delivery device 200 via line 201. One of ordinary skill in the art will recognize that delivery device 200 may be any of the devices of FIGS. 1-3 or variations thereof. If necessary, line 201 may be heated to maintain the fluorinated reactant in vapor form. An inert gas 300, such as Ar, may be delivered to the delivery device 200 via line 301. The inert gas 300 may also be delivered to the reactor 400 via line 302.

One of ordinary skill in the art will recognize that lines 201, 301, and 302 may include numerous pressure gauges, check valves, valves, and pressure regulators and that additional lines for pressure regulation or by-pass flow have not been included in order to simplify the drawing.

Example 1: Test for Oxide Layer Etching by $NbF_5$ $Nb_2O_5$, $Ta_2O_5$, $ZrO_2$, $HfO_2$, $TiO_2$, and $Al_2O_3$ layer that were 336 Å, 288 Å, 364 Å, 344 Å, 337 Å, and 253 Å thick, respectively, were deposited on a silicon substrate by atomic layer deposition. The thickness of the layers was determined using ellipsometry. One of ordinary skill in the art would recognize that scanning electron microscopy (SEM), transmission electron microscopy (TEM), X-ray photoelectron spectroscopy (XPS), secondary ionization mass spectroscopy (SIMS), or Auger Electron Spectroscopy (AES) may also be used to measure the thickness of the layer before and after etching.

The $Nb_2O_5$, $Ta_2O_5$, $ZrO_2$, $HfO_2$, $TiO_2$, and $Al_2O_3$ substrates and a and a 1974 Å thick $SiO_2$ substrate were introduced into the thermal reactor 400 of FIG. 4 via load lock chamber 102 and placed on the wafer stage 101 heated to 200° C., 300° C., 350° C., or 400° C. The reactor 400 pressure was maintained at 5-6 Torr. The $NbF_5$ was placed in a sublimator vessel 200 heated to 74° C. and its vapors introduced continuously into the reactor 400 with an Ar carrier gas 300 at 255 sccm. The thickness of the oxide layers were measured after 30 and 60 seconds (experiments at 200° C. and 300° C.); 5, 10, 20, 30, and 60 seconds (experiment at 350° C.); and 1, 3, 5, 10, 20, 30, and 60 seconds (experiment at 400° C.). At 200° C., none of the oxide layers were reduced after 30 and 60 seconds.

At 300° C., $Nb_2O_5$ was reduced to 123 Å after 30 seconds and 33 Å after 60 seconds, $Ta_2O_5$ was reduced to 106 Å after 30 seconds and 14 Å after 60 seconds, $TiO_2$ was reduced to 261 Å after 30 seconds and 216 Å after 60 seconds.

At 350° C., $Nb_2O_5$ was reduced to 218 Å after 5 seconds and 31 Å after 10 seconds; $Ta_2O_5$ was reduced to 174 Å after 5 seconds and 55 Å after 10 seconds; $ZrO_2$ was reduced to 344 Å after 10 seconds, 337 Å after 20 seconds, 329 Å after 30 seconds, and 305 Å after 60 seconds; $HfO_2$ was reduced to 340 Å after 10 seconds, 339 Å after 20 seconds, 337 Å after 30 seconds, and 334 Å after 60 seconds; and $TiO_2$ was reduced to 276 Å after 5 seconds, 257 Å after 10 seconds, 96 Å after 20 seconds, and 57 Å after 30 seconds.

Applicant observed fluorine containing layer deposition after the $Nb_2O_5$, $Ta_2O_5$, and $TiO_2$ layer was fully etched at 350° C. and 400° C. and after the $ZrO_2$ layer was fully etched at 400° C. When deposits were formed, the deposition rate decreased with time. In other words, the etching rate was quicker at the beginning of the etch process than it was towards the end of the etch process. This effect may be able to be controlled by controlling etchant introducing time.

At 400° C., $Nb_2O_5$ was reduced to 254 Å after 1 second, 142 Å after 3 seconds, and 43 Å after 5 seconds; $Ta_2O_5$ was reduced to 217 Å after 1 second, 89 Å after 3 seconds, 73 Å after 5 seconds, and 53 Å after 10 seconds; $ZrO_2$ was reduced to 217 Å after 5 seconds and 120 Å after 10 seconds; $HfO_2$ was reduced to 336 Å after 10 seconds, 298 Å after 20 seconds, 292 Å after 30 seconds, and 291 Å after 60 seconds; and $TiO_2$ was reduced to 270 Å after 5 seconds and 157 Å after 10 seconds.

Figure 5:
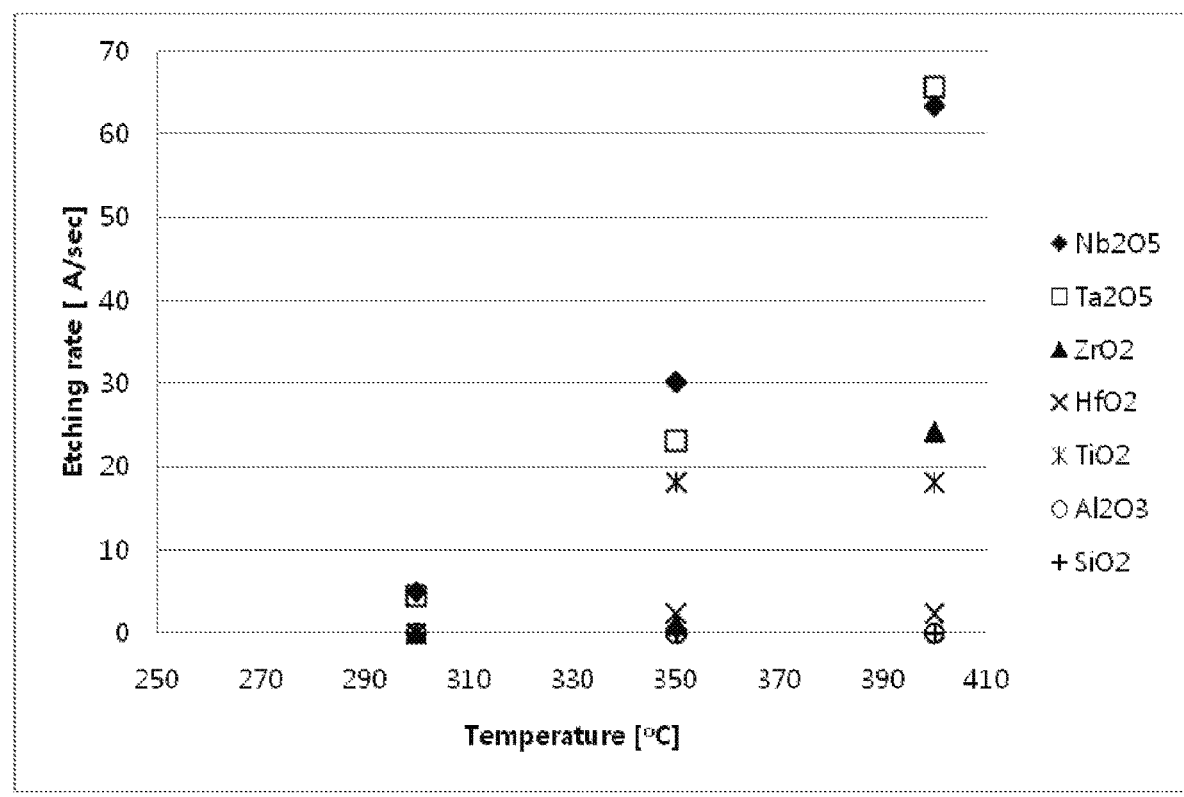
FIG. 5 is a graph displaying the thickness of different oxide layers as a function of $NbF_5$ introduction time in a thermal reactor at 5-7 Torr.

FIG. 5 displays these etching rates (Å/second) as a function of $NbF_5$ introduction time and temperature.

TABLE 1 displays the film etching rate (Å/second) as a function of temperature.

TABLE 1

Summary of oxide etching rates by $NbF_5$

| Layer | $NbF_5$ | | | |
| --- | --- | --- | --- | --- |
| | 200° C. | 300° C. | 350° C. | 400° C. |
| $Nb_2O_5$ | 0 | 5 | 30.1/D | 63.4/D |
| $Ta_2O_5$ | 0 | 4.5 | 23.1/D | 65.6/D |
| $ZrO_2$ | 0 | 0 | 0.9 | 24.2/D |
| $HfO_2$ | 0 | 0 | 0.12 | 2.4 |
| $TiO_2$ | 0 | 2 | 11.7/D | 18.1/D |
| $Al_2O_3$ | 0 | 0 | 0 | 0 |
| $SiO_2$ | 0 | 0 | 0 | 0 |

[a] The etching rate is provided as the average of the etch rate (ER) for each time period at each temperature (e.g., = [(ER at 30 sec + ER at 60 sec)/2] for 200° C. and 300° C.; = [(ER at 5 sec + ER at 10 sec + ER at 20 sec + ER at 30 sec + ER at 60 sec)/5] for 350° C.; etc.).
D deposition of film was observed after original layer was fully etched Example 2: Test for Nitride Layer Etching by $NbF_5$ TiN (200 Å), TaN (280 Å) and SiN (500 Å) layers were prepared. The substrates containing the nitride layers were introduced into the thermal reactor 400 of FIG. 4 via load lock chamber 102 and placed on the wafer stage 101 heated to 350° C., 400° C., or 425° C. The reactor 400 pressure was fixed at 5-6 Torr. $NbF_5$ was placed in a vessel 200 heated to 74° C. and its vapors introduced into the reactor 400 with an Ar carrier gas 300 at 255 sccm. The thickness of the TiN and TaN layers were measured using a scanning electron microscope (SEM) after 5, 10, 15, 30 seconds. The thickness of SiN layer was measured using Ellipsometer after 30 seconds and 90 seconds. The film thickness was not changed for any of the nitride films and etching was not observed at any temperatures. TABLE 2 displays the summary of film etching rate (Å/second) as a function of $NbF_5$ introduction time and temperature.

TABLE 2

Summary of nitride etching rates by $NbF_5$

| Layer | $NbF_5$ | | |
| --- | --- | --- | --- |
| | 350° C. | 400° C. | 425° C. |
| | Etching rate[Å/sec] [a] | | |
| TiN | 0 | 0 | — |
| TaN | 0 | 0 | — |
| SiN | — | — | 0 |

[a] The etching rate is provided as the average of the etch rate (ER) for each time period (i.e., = [(ER at 5 sec + ER at 10 sec + ER at 15 sec + ER at 30 sec)/4] for TiN and TaN or = [(ER at 30 sec + ER at 90 sec)/2] for SiN).
— Experiment was not performed

Example 3: Test for Oxide and Nitride Layer Etching by $VF_5$ $Nb_2O_5$, $Ta_2O_5$, $ZrO_2$, $HfO_2$, $TiO_2$, $Al_2O_3$, $SiO_2$, TiN, and TaN substrates were introduced into the thermal reactor 400 of FIG. 4 via load lock chamber 102 and placed on the wafer stage 101 heated to 150° C., 200° C., 300° C., 350° C., or 400° C.

The reactor 400 pressure was maintained at 5-6 Torr. The $VF_5$ was placed in a vessel 200 at room temperature. The vapors were introduced continuously into the reactor 400 without any carrier gas.

Figure 6:
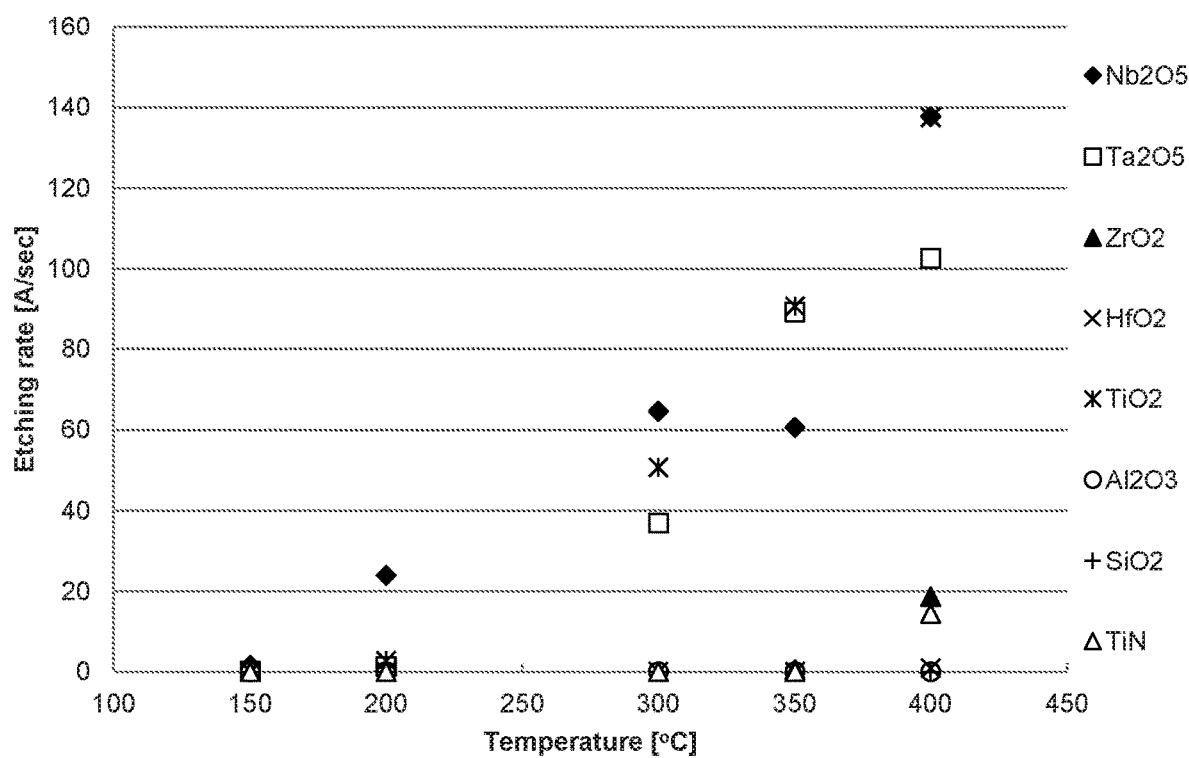
FIG. 6 is a graph displaying the thickness of different oxide and nitride layers as a function of $VF_5$ introduction time in a thermal reactor at 5-7 Torr.

FIG. 6 displays the thickness of the different oxide layers as a function of $VF_5$ introduction time and temperature. The thickness of the oxide layers were measured by Ellipsometer after 30 and 90 seconds total $VF_5$ introduction at 150° C.; after 10 and 30 seconds at 200° C.; after 3, 5, 6, 8 and 30 seconds at 300° C.; after 2, 3, 5, 10 and 30 seconds at 350° C.; and after 1, 2, 3, 5, 10 and 30 seconds at 400° C.

TABLE 3 displays summary of the film etching rate (Å/second) as a function of $VF_5$ introduction time and temperature. Oxide layers and SiN were measured by Ellipsometer and TiN and TaN was observed by SEM.

TABLE 3

Summary of etching rates by $VF_5$

| Layer | 150° C. | 200° C. | 300° C. | 350° C. | 400° C. |
|---|---|---|---|---|---|
| | \multicolumn{5}{c}{Etching rate [Å/sec]$^a$} |
| $Nb_2O_5$ | 1.6 | 24.0 | 64.4/D | 60.6/D | 137.7/D |
| $Ta_2O_5$ | 0.15 | 1.3 | 36.9/D | 89.3/D | 102.6/D |
| $ZrO_2$ | 0 | 0 | 0 | 0 | 6.6 |
| $HfO_2$ | 0 | 0 | 0 | 0 | 0 |
| $TiO_2$ | 0.13 | 2.7 | 50.7/D | 90.7/D | 137.5/D |
| $Al_2O_3$ | 0 | 0 | 0 | 0 | 0 |
| $SiO_2$ | 0 | 0 | 0 | 0 | 0 |
| TiN | E | E | E | E | 14.4 |
| TaN | — | E | E/D | E/D | E/D |

$^a$ The etching rate is provided as the average of the etch rate (ER) for each time period at each temperature (e.g., = [(ER at 30 sec + ER at 90 sec)/2] at 150° C.; = [(ER at 10 sec + ER at 30 sec)/2] at 200° C.; etc.).
— Experiment was not performed
E Etched
D deposition of film was observed after original layer was fully etched
E/D Etching and deposition was observed

Example 4: Test for Oxide and Nitride Layer Etching by $MoF_6$ $Nb_2O_5$, $Ta_2O_5$, $ZrO_2$, $HfO_2$, $TiO_2$, $Al_2O_3$, $SiO_2$, TiN, TaN, and SiN substrates were introduced into the thermal reactor 400 of FIG. 4 via load lock chamber 102 and placed on the wafer stage 101 heated to 150° C., 200° C., 300° C., 350° C., 400° C., or 425° C.

The reactor 400 pressure was maintained at 5-6 Torr. The $MoF_6$ was placed in a vessel 200 at room temperature. The $MoF_6$ vapors were introduced continuously into the reactor 400 without any carrier gas.

Figure 7:
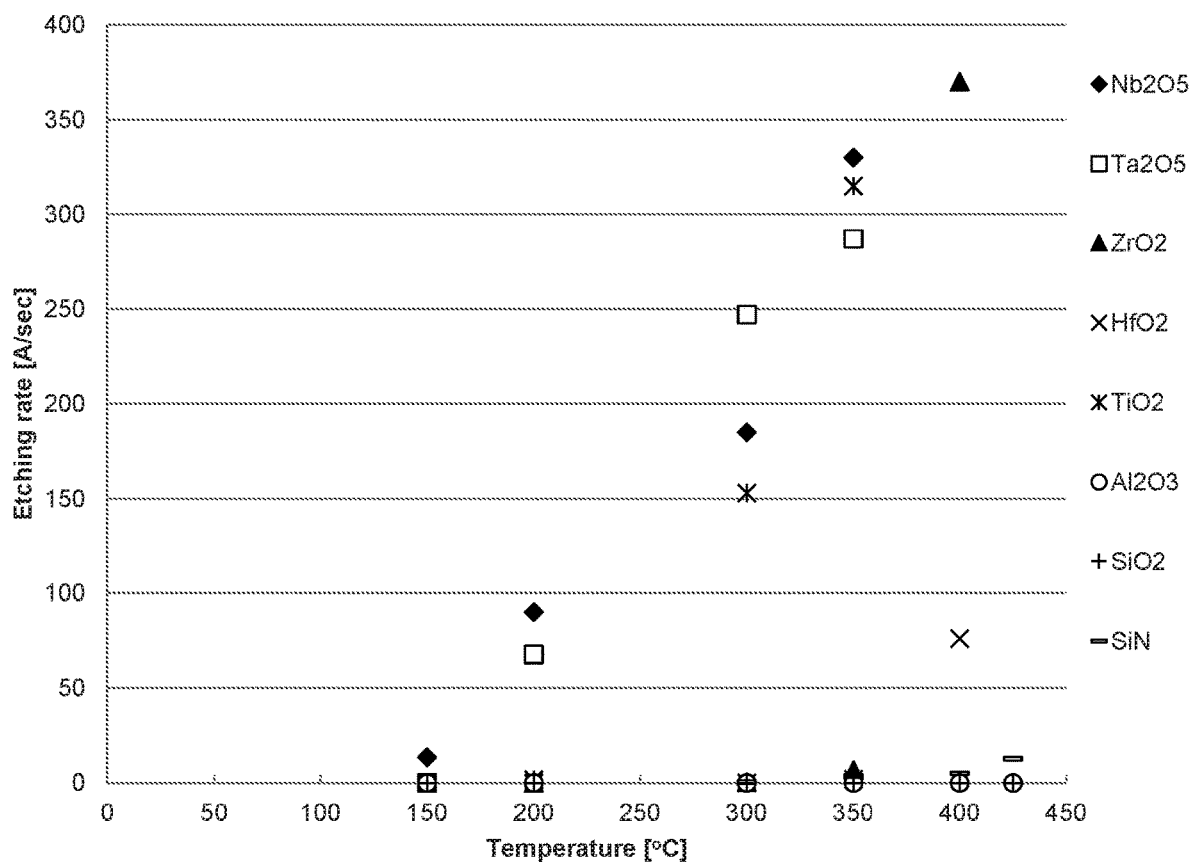
FIG. 7 is a graph displaying the thickness of different oxide and nitride layers as a function of $MoF_6$ introduction time in a thermal reactor at 5-7 Torr.

FIG. 7 displays the thickness of the different oxide layers as a function of $MoF_6$ introduction time and temperature. Oxide layers and SiN were measured by Ellipsometer after 10, 20 and 30 seconds total $MoF_6$ introduction at 150° C.; after 1, 3, 10 and 30 seconds at 200° C.; after 1, 3, 10, 20 and 30 seconds at 300° C.; after 1, 3, 5, 10, 20 and 30 seconds at 350° C.; and after 1, 2, 10 and 30 seconds at 400° C. TiN and TaN were measured by SEM. TABLE 4 displays summary of film etching rate (Å/second) as a function of $MoF_6$ introduction time and temperature.

TABLE 4

Summary of etching rate by $MoF_6$

| Layer | 150° C. | 200° C. | 300° C. | 350° C. | 400° C. | 425° C. |
|---|---|---|---|---|---|---|
| | \multicolumn{6}{c}{$MoF_6$ Etching rate[Å/sec]} |
| $Nb_2O_5$ | 13.5 | 90.0 | 185 | >330 | >330 | >330 |
| $Ta_2O_5$ | 0 | 67.7 | 247 | >287 | >287 | >287 |
| $ZrO_2$ | 0 | 0 | 0.46 | 6.7 | ~370 | >370 |
| $HfO_2$ | 0 | 0 | 0 | 1.9 | 76.1 | E/D |
| $TiO_2$ | 0 | 1.7 | 153 | >315 | >315 | >315 |
| $Al_2O_3$ | 0 | 0 | 0 | 0 | 0 | 0 |
| $SiO_2$ | 0 | 0 | 0 | 0 | 0 | 0 |
| TiN | 0 | E | E | E | E | E |
| TaN | 0 | 0 | E/D | E/D | E/D | E/D |
| SiN | — | — | 0.46 | 3.8 | 5.1 | 12.8 |

$^a$ The etching rate is provided as the average of etch rate (ER) for each time period at each temperature (i.e., = [(ER at 10 sec + ER at 20 sec + ER at 30 sec)/3] for 150° C.; = [(ER at 1 sec + ER at 3 sec + ER at 10 sec + ER at 30 sec)/4] for 200° C.; etc.).
— Experiment was not performed
E Etched
E/D Etching and deposition was observed after original layer was fully etched

Example 5: Test for Oxide Layer Etching by $VF_5$ by Pulsed Mode $ZrO_2$, $Nb_2O_5$, $Ta_2O_5$, $HfO_2$, and $TiO_2$ substrates were introduced into the thermal reactor 100 of FIG. 4 via load lock chamber 102 and placed on the wafer stage 101 heated to 300° C., 350° C., or 400° C.

The reactor 100 pressure was maintained at 1 Torr. The $VF_5$ was placed in a vessel 200 at 74° C. temperature. Its vapors were introduced into the reactor 100 by pulsed mode (1 sec introduction/5 sec purging as 1 cycle). Film thickness was measured after 5, 10, 20, 30 and 60 cycles by Ellipsometer and etching rate was estimated. Etching rates (Å/cycle) per temperature (° C.) are summarized in TABLE 5:

TABLE 5

Summary of etching rate$^a$ by $VF_5$

| Temp. (° C.) | $Nb_2O_5$ | $Ta_2O_5$ | $ZrO_2$ | $HfO_2$ | $TiO_2$ |
|---|---|---|---|---|---|
| 300 | 7.73 | 2.86 | 0.2 | 0 | 1.15 |
| 350 | 20.1 | 9.5 | 3.6 | 0.67 | — |
| 400 | 69.1 | 20.9 | 12.2 | 2.6 | — |

$^a$The etching rate is provided as the average of etch rate (ER) for each cycle at each temperature (i.e., = [(ER after 5 cycles + ER after 10 cycles + ER after 20 cycles + ER after 30 cycles + ER after 60 cycles)/5] for 300° C.; etc.).
— No experiment was done.

Summary of Examples 1-5

As can be seen, little to no etching of $Al_2O_3$ (o) and $SiO_2$ (+) layers occurred from the $NbF_5$, $VF_5$ and $MoF_6$ etchants at temperatures ranging from 150° C. to 425° C. As a result $Al_2O_3$ and $SiO_2$ may be used as an etch stop or substrate when $NbF_5$, $VF_5$ and $MoF_6$ is used as an etchant.

In contrast, $Nb_2O_5$ (♦), $Ta_2O_5$ (□) and $TiO_2$ (Ж) layers were etched by $NbF_5$ at temperatures above 300° C. and the amount of etching increased with increasing temperature. As a result, the temperature of the $NbF_5$ etching process may be adjusted depending on the control required. In other words, for processes requiring high precision, lower temperature processes (i.e., below 300° C.) having lower etching rates (approximately 5 Å/sec) may be performed. The temperature may be increased for process that do not require as much precision, such as removing oxide from chamber walls.

Little to no etching of $ZrO_2$ (▲), $HfO_2$ (x) and $TiO_2$ (✱) occurred at 300° C. At 350° C., $ZrO_2$ was minimally etched and $HfO_2$ was etched at below 5 Å/sec. In contrast, $TiO_2$ was attached at almost 20 Å/sec at 350° C. Therefore, 350° C. provides a good temperature to selectively etch $TiO_2$ from a $HfO_2$ and/or $ZrO_2$ substrate. Etching of $HfO_2$ remained below 5 Å/sec at 400° C. However, both $TiO_2$ and $ZrO_2$ were both etched at approximately 20 Å/sec at 400° C. Therefore, 400° C. provides a good temperature to selectively etch $TiO_2$ and/or $ZrO_2$ from a $HfO_2$ substrate.

In contrast, by using $VF_5$, TiN and TaN were etched at lower temperature (<200° C.). By using $MoF_6$, SiN was etched from 300° C.

One of ordinary skill in the art will recognize that temperatures and etch rates may vary from reactor to reactor. Similarly, the reactivity of alternative fluorinated reactants may vary from those of the $NbF_5$, $VF_5$ and $MoF_6$ etchants. Nonetheless, the results above demonstrate that the disclosed reactants may be used to selectively etch oxide and nitride layers from varying substrates and at varying etch rates, making them excellent candidates for future oxide and nitride removal processes, such as CMOS gate stacks.

Figure 9A:
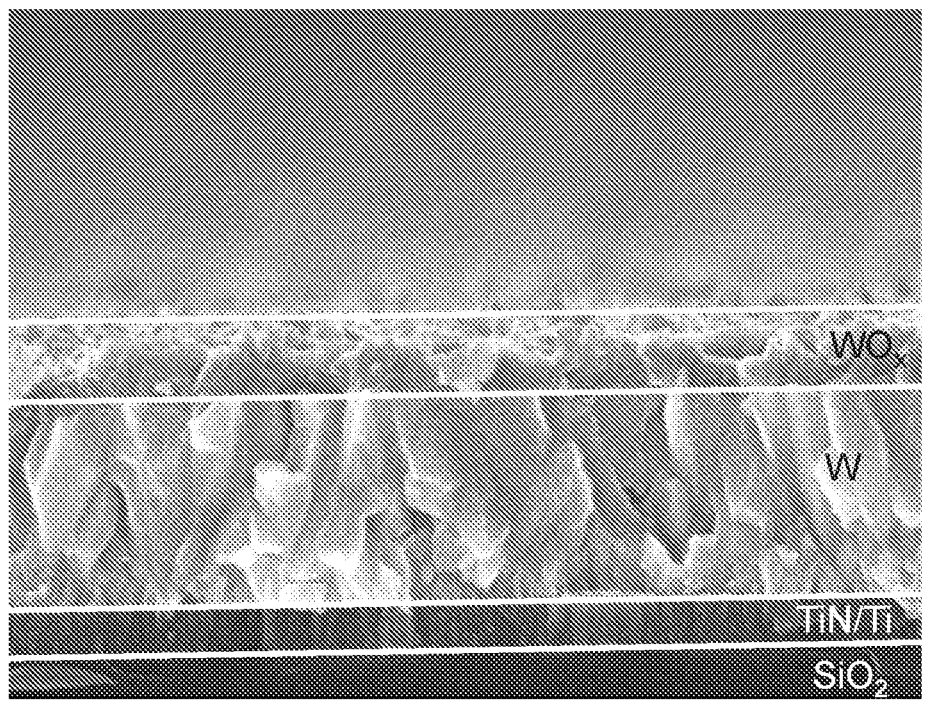
FIG. 9a is a Scanning Electron Microscope (SEM) image of an approximately 120 nm thick layer of tungsten oxide formed from a tungsten layer on a Ti/TiN layer.
Figure 9B:
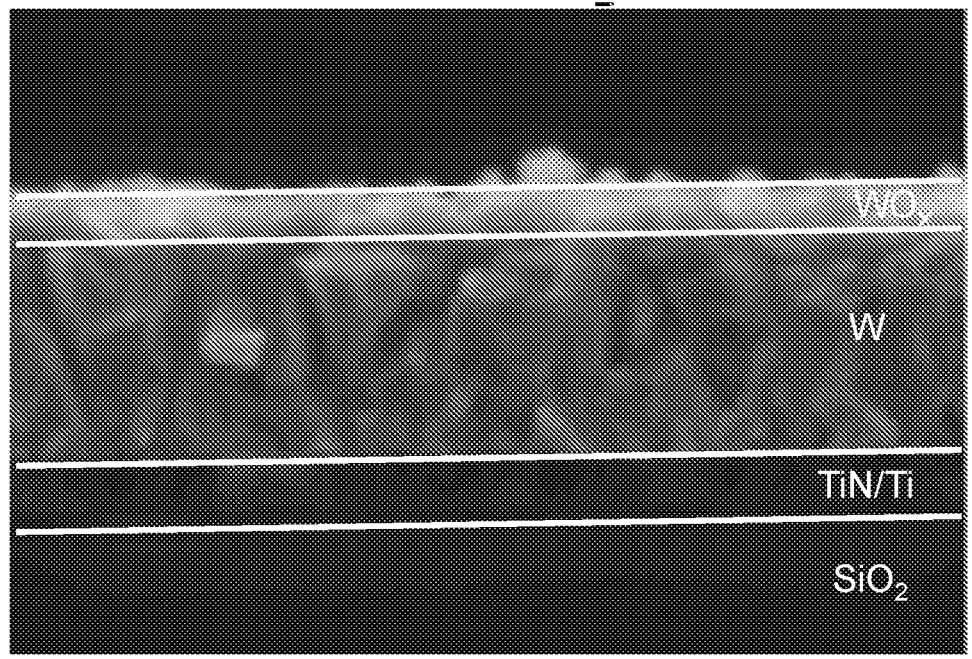
FIG. 9b is an Energy Dispersive X-ray (EDX) map of the same approximately 120 nm thick layer of tungsten oxide formed from a tungsten layer on a Ti/TiN layer.
Figure 9C:
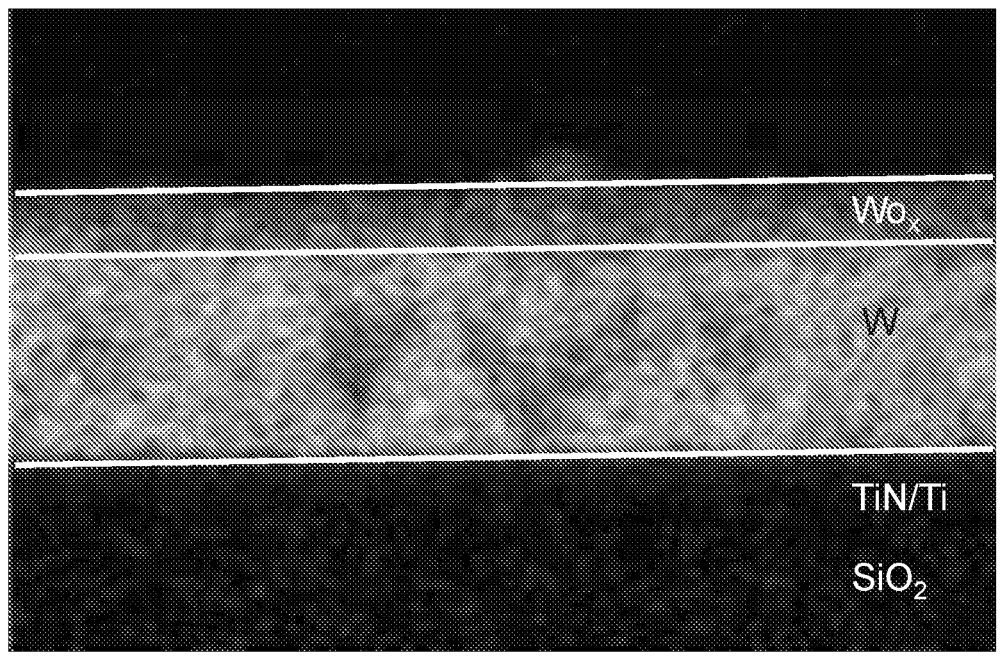
FIG. 9c is the EDX map of FIG. 9b showing the intensity of tungsten.
Figure 9D:
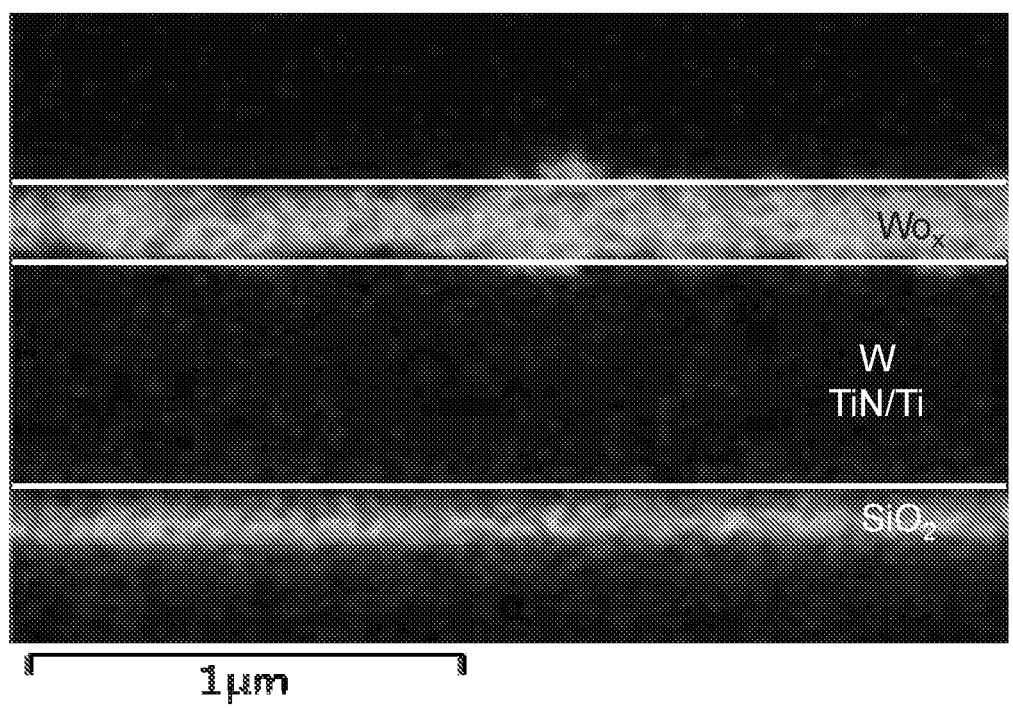
FIG. 9d is the EDX map of FIG. 9b showing the intensity of oxygen.

Example 6: Metal Layer Etching Via Oxidation Followed by Etching (Metal oxide formation) W metal substrate was introduced into the thermal reactor 400 of FIG. 4 via load lock chamber 102 and placed on the wafer stage 101 heated at 350° C. 300 sccm of ozone gas was introduced to the reactor for 10 minutes and the surface of W wafer was oxidized to form a tungsten oxide ($WO_x$, x=1-4) layer approximately 120 nm thick. Tungsten oxide formation was confirmed by Scanning Electron Microscopy, as shown in FIG. 9a, and Energy Dispersive Xray (EDX) mapping, as shown in FIG. 9b, FIG. 9c, and FIG. 9d. FIG. 9b is the EDX base image used for the elemental mapping of FIGS. 9c and 9d. FIG. 9c shows the intensity of W: with no W evident in the underlying $TiN/SiO_2$ layers and a lower concentration of W in the upper $WO_x$ layer. Distinction between the TiN/Ti and $SiO_2$ layers is not possible in FIG. 9c based on the W signal. FIG. 9d shows the intensity of O: with O showing in the $WO_x$ layer and the $SiO_2$ layer and no oxygen in the W and TiN/Ti layers. Distinction between the W and TiN/Ti layers is not possible in FIG. 9d based on the O signal.

(Metal Oxide Etching)

After measuring the tungsten oxide thickness, the $WO_x$ substrates were re-introduced into the thermal reactor 400 of FIG. 4 via load lock chamber 102 and placed on the wafer stage 101 heated to 300° C., 350° C., or 400° C. One of ordinary skill in the art would recognize that the substrate was removed for measurement purposes and that the substrate would not need to be removed from the thermal reactor 400 during normal processing. In other words, the oxide layer could be formed from a metal substrate and etched without being removed from the chamber.

The reactor 400 pressure was maintained at 5-7 Torr. The solid form of $NbF_5$ was placed in a sublimator vessel 200 at 74° C. temperature. Its vapors were introduced into the reactor 400. SEM measurement was conducted after 200 seconds at 300° C.; 5, 10 and 15 seconds at 350° C.; and 1, 2 and 3 seconds at 400° C.

Figure 10:
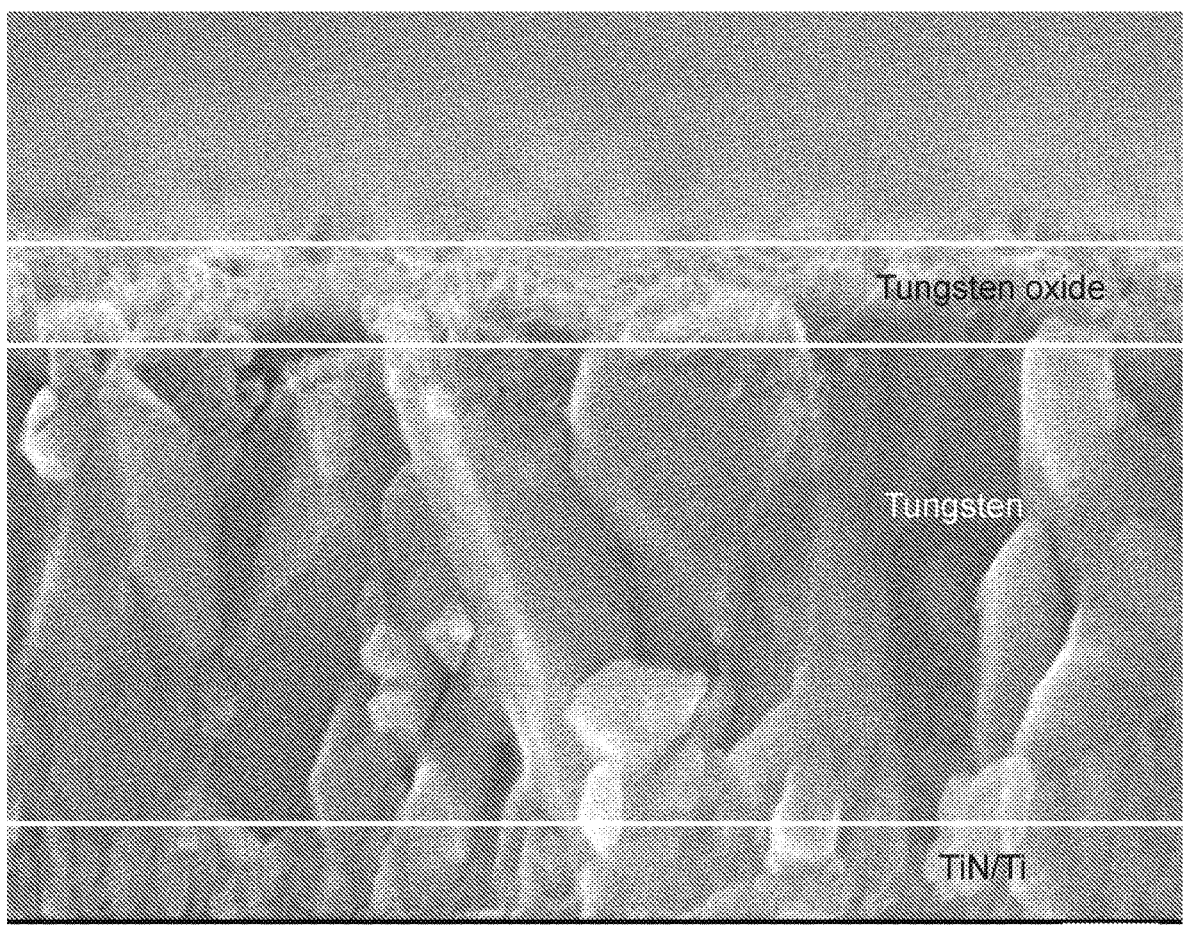
FIG. 10 is a SEM image of the approximately 100 nm thick tungsten oxide layer of FIG. 9a remaining after 200 seconds of etching by $NbF_5$ at 300° C.
Figure 11A:
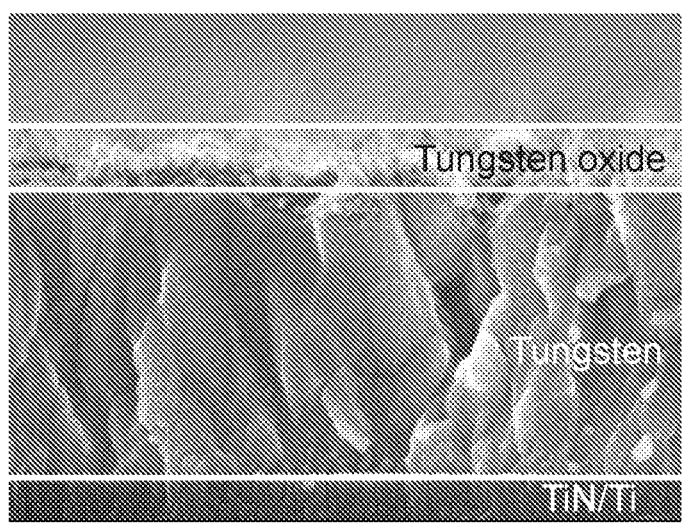
FIG. 11a is a SEM image of the approximately 52 nm thick tungsten oxide layer of FIG. 9a remaining after 5 seconds of etching by $NbF_5$ at 350° C.
Figure 11B:
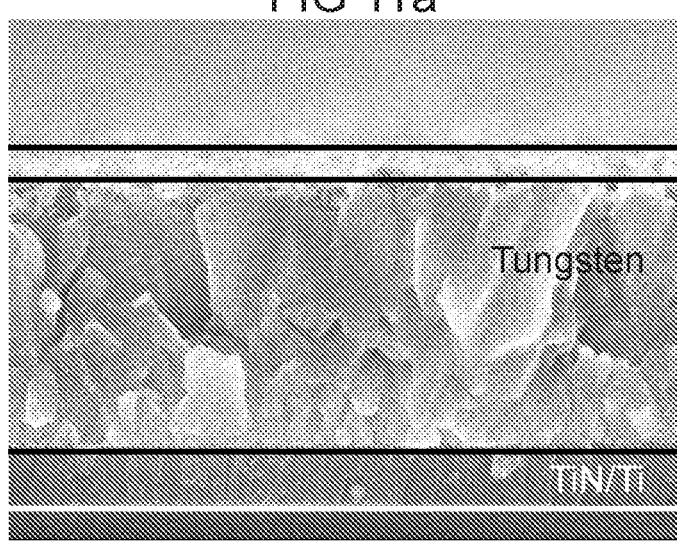
FIG. 11b is a SEM image of the approximately 45 nm thick tungsten oxide layer of FIG. 9a remaining after 10 seconds of etching by $NbF_5$ at 350° C.
Figure 11C:
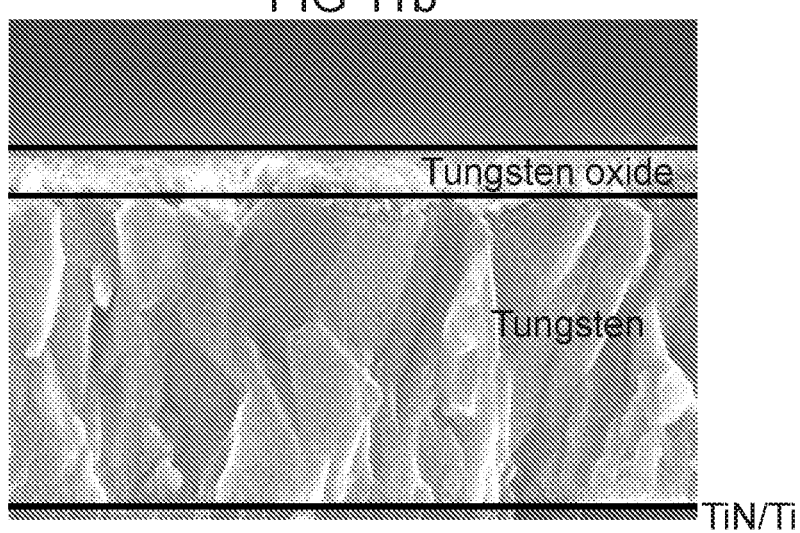
FIG. 11c is a SEM image of the approximately 25 nm thick tungsten oxide layer of FIG. 9a remaining after 15 seconds of etching by $NbF_5$ at 350° C.
Figure 12A:
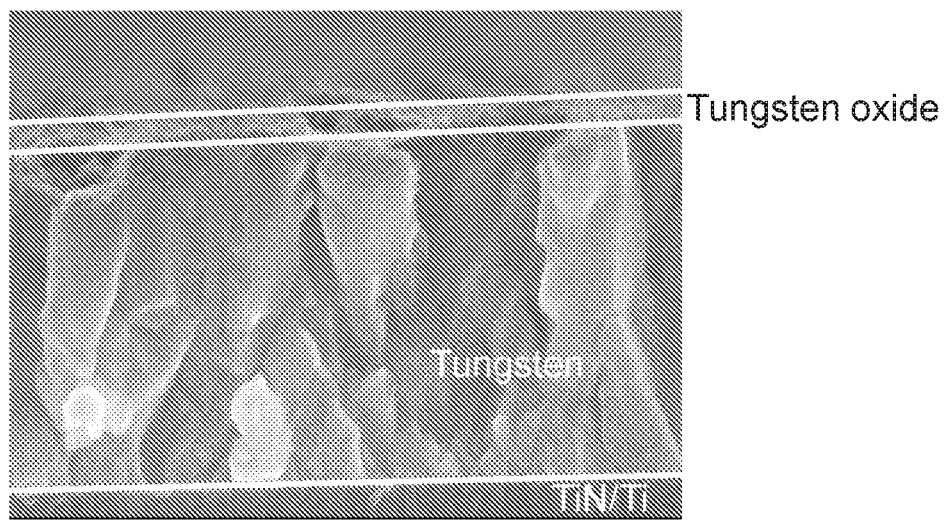
FIG. 12a is a SEM image of the tungsten oxide layer of FIG. 9a remaining after 1 second of etching by $NbF_5$ at 400° C.
Figure 12B:
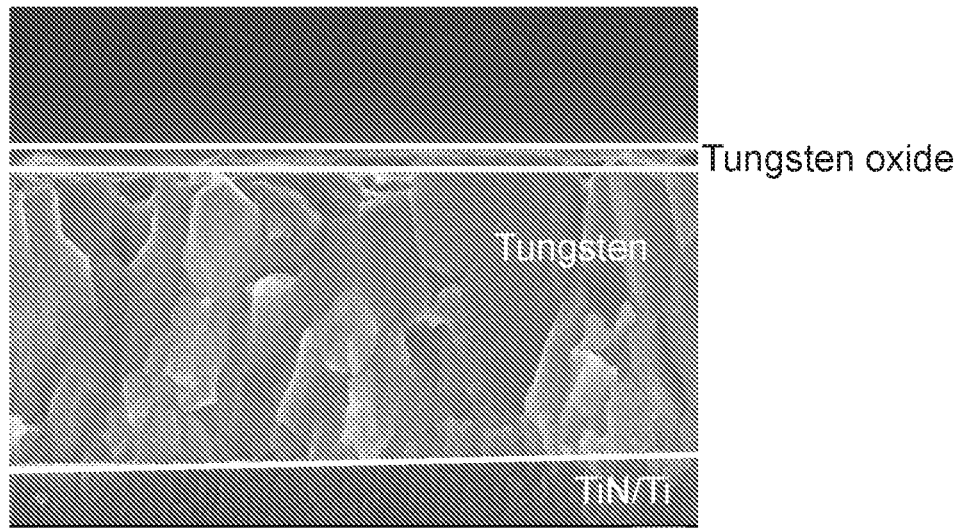
FIG. 12b is a SEM image of the tungsten oxide layer of FIG. 9a remaining after 2 seconds of etching by $NbF_5$ at 400° C.
Figure 12C:
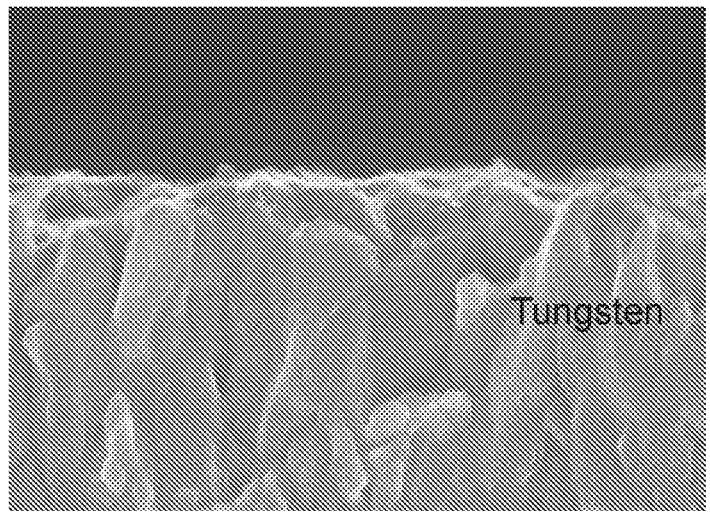
FIG. 12c is a SEM image of the tungsten layer remaining after 3 seconds of etching the tungsten oxide layer by $NbF_5$ at 400° C. resulted in complete removal of the tungsten oxide layer.

FIGS. 10-12 display the thickness evolution of a metal film subject to the oxide removal process at different temperatures. More particularly, FIG. 10 is a SEM image of the approximately 100 nm thick tungsten oxide layer remaining after 200 seconds of etching by $NbF_5$ at 300° C. FIG. 11a is a SEM image of the approximately 52 nm thick tungsten oxide layer remaining after 5 seconds of etching by $NbF_5$ at 350° C. FIG. 11b is a SEM image of the approximately 45 nm thick tungsten oxide layer remaining after 10 seconds of etching by $NbF_5$ at 350° C. FIG. 11c is a SEM image of the approximately 25 nm thick tungsten oxide layer remaining after 15 seconds of etching by $NbF_5$ at 350° C. FIG. 12a is a SEM image of the tungsten oxide layer remaining after 1 second of etching by $NbF_5$ at 400° C. FIG. 12b is a SEM image of the tungsten oxide layer remaining after 2 seconds of etching by $NbF_5$ at 400° C. FIG. 12c is a SEM image of the tungsten layer remaining after 3 seconds of etching the tungsten oxide layer by $NbF_5$ at 400° C. resulted in complete removal of the tungsten oxide layer. Once again, the etching rate increased with increasing temperature. As a result, the temperature of the $NbF_5$ etching process may be adjusted depending on the control required. In other words, for processes requiring high precision, lower temperature processes (i.e., below 300° C.) having lower etching rates may be performed. The temperature may be increased for process that do not require as much precision, such as removing oxide from chamber walls.

While performed in the R&D facility as a two-step process, the above test results demonstrate that a cyclic metal oxidation and metal oxide etch process may be performed to remove thicker metal layers (e.g., metal layers having a thickness greater than 200 nm). Applicants believe that a metal oxide layer having a thickens ranging from approximately 0.2 nm to approximately 200 nm inclusive may be oxidized or nitridized in one step, depending of course upon the metal and oxidation/nitridization conditions.

While embodiments of this invention have been shown and described, modifications thereof can be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A method of removing layers from a substrate using a fluorinated reactant comprising the steps of: (a) introducing a vapor of the fluorinated reactant into a reactor having a substrate disposed therein, the substrate having a layer thereon, and (b) etching at least part of the layer from the substrate, the fluorinated reactant selected from the group consisting of $VF_5$, $NbF_5$, $MoF_6$, $NbF_5(SEt)$, and $NbF_4(SEt)_2$.

2. The method of claim 1, wherein the substrate is a silicon wafer, silicon oxide, stainless steel, aluminum nitride, or aluminum oxide.

3. The method of claim 1, wherein the layer is a metal layer, further comprising (c) oxidizing or nitridizing the metal layer prior to step (a) introducing the vapor of the fluorinated reactant.

4. The method of claim 3, wherein the metal layer is selected from the group consisting of a tungsten layer, a molybdenum layer, a tantalum layer, a niobium layer, a vanadium layer, a hafnium layer, a zirconium layer, a titanium layer, and combinations thereof.

5. The method of claim 3, further comprising repeating steps (c), (a), and (b).

6. The method of claim 1, wherein the substrate is silicon oxide, aluminum oxide, or a silicon wafer and the layer is selected from the group consisting of titanium oxide, zirconium oxide, hafnium oxide, vanadium oxide, niobium oxide, tantalum oxide, molybdenum oxide, tungsten oxide, and combinations thereof.

7. The method of claim 1, wherein the fluorinated reactant is $NbF_5$.

8. The method of claim 1, wherein the fluorinated reactant is $VF_5$.

9. A dry etching method for selectively etching a layer from a substrate by reacting a vapor of a fluorinated reactant with the layer to form volatile fluorinated species, the fluorinated reactant selected from the group consisting of $VF_5$, $NbF_5$, $MoF_6$, $NbF_5(SEt)$, and $NbF_4(SEt)_2$.

10. The method of claim 9, wherein the substrate is stainless steel, silicon oxide, aluminum oxide, a silicon wafer, or aluminum nitride.

11. The method of claim 9, wherein the layer is a metal layer, further comprising oxidizing or nitridizing the metal layer prior to reacting the vapor of the fluorinated reactant with the layer.

12. The method of claim 11, wherein the metal layer is selected from the group consisting of a tungsten layer, a molybdenum layer, a tantalum layer, a niobium layer, a vanadium layer, a hafnium layer, a zirconium layer, a titanium layer, and combinations thereof.

13. The method of claim 11, further comprising repeating the oxidizing or nitridizing and reacting steps.

14. The method of claim 9, wherein the substrate is silicon oxide, aluminum oxide, or a silicon wafer and the layer is selected from the group consisting of titanium oxide, zirconium oxide, hafnium oxide, vanadium oxide, niobium oxide, tantalum oxide, molybdenum oxide, tungsten oxide, and combinations thereof.

15. The method of claim 9, wherein the fluorinated reactant is $NbF_5$.

16. The method of claim 9, wherein the fluorinated reactant is $VF_5$.

* * * * *

UNITED STATES PATENT AND TRADEMARK OFFICE
CERTIFICATE OF CORRECTION

PATENT NO. : 10,648,087 B2
APPLICATION NO. : 15/774892
DATED : May 12, 2020
INVENTOR(S) : Clément Lansalot-Matras et al.

It is certified that error appears in the above-identified patent and that said Letters Patent is hereby corrected as shown below:

In the Specification

At Column 5, Line 5, delete "$NbF_4(SEt_2)$" and add --$NbF_4(SEt_2)_2$--

In the Claims

At Column 26, Lines 56-57, in Claim 1, delete "$NbF_5(SEt)$, and $NbF_4(SEt)_2$" and add --$NbF_5(SEt_2)$, and $NbF_4(SEt_2)_2$--

At Column 27, Line 19, in Claim 9, delete "$NbF_5(SEt)$, and $NbF_4(SEt)_2$" and add --$NbF_5(SEt_2)$, and $NbF_4(SEt_2)_2$--

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*